(12) United States Patent
Lu et al.

(10) Patent No.: US 12,174,528 B2
(45) Date of Patent: Dec. 24, 2024

(54) STORAGE ENVIRONMENT MONITORING SYSTEM AND METHODS OF OPERATION

(71) Applicant: Taiwan Semiconductor Manufacturing Company, Ltd., Hsinchu (TW)

(72) Inventors: Chen-Wei Lu, Hsinchu (TW); Chuan Wei Lin, Hsinchu (TW); Chun-Hau Chen, Hsinchu (TW); Kuan Yu Lai, Hsinchu (TW); Fu-Hsien Li, Hsinchu (TW); Chi-Feng Tung, Hsinchu (TW); Hsiang Yin Shen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 630 days.

(21) Appl. No.: 17/214,367

(22) Filed: Mar. 26, 2021

(65) Prior Publication Data
US 2022/0308442 A1  Sep. 29, 2022

(51) Int. Cl.
*G05B 19/418* (2006.01)
*G03F 1/66* (2012.01)
(Continued)

(52) U.S. Cl.
CPC .............. *G03F 1/66* (2013.01); *G03F 1/84* (2013.01); *G03F 7/70741* (2013.01);
(Continued)

(58) Field of Classification Search
CPC .......... G03F 1/66; G03F 1/84; G03F 7/70741; G03F 7/70858; G03F 7/7085;
(Continued)

(56) References Cited

U.S. PATENT DOCUMENTS

| 8,776,841 B2 | 7/2014 | Kishkovich et al. |
| 11,255,322 B2 | 2/2022 | Mou et al. |

(Continued)

FOREIGN PATENT DOCUMENTS

| CN | 204439139 U | 7/2015 |
| CN | 205373754 U | 7/2016 |

(Continued)

*Primary Examiner* — Yuhui R Pan
(74) *Attorney, Agent, or Firm* — Harrity & Harrity, LLP

(57) ABSTRACT

A storage environment monitoring device is capable of measuring and/or monitoring various parameters of an environment inside a storage area, such as airflow, temperature, and humidity, to increase the storage quality of semiconductor components stored in the storage area. The storage environment monitoring device is capable of measuring and/or monitoring the parameters of the environment inside the storage area without having to open an enclosure that is storing the semiconductor components in the storage area. This reduces exposure of the semiconductor components to contamination and other environmental factors. In addition, the storage environment monitoring device may perform automatic measurements inside the storage area based on usage schedules of the semiconductor components that are to be stored in the storage area, which decreases downtime of the storage area and/or the semiconductor components, and increases productivity in a semiconductor processing environment in which the semiconductor components are used.

20 Claims, 22 Drawing Sheets

(51) Int. Cl.
*G03F 1/84* (2012.01)
*G03F 7/00* (2006.01)
*G06N 20/00* (2019.01)

(52) U.S. Cl.
CPC ..... *G03F 7/70858* (2013.01); *G05B 19/4184* (2013.01); *G05B 19/4189* (2013.01); *G06N 20/00* (2019.01)

(58) Field of Classification Search
CPC ............ G03F 7/70916; G05B 19/4184; G05B 19/4189; G06N 20/00; G06F 11/3034; G06F 11/3058; G06F 18/241
See application file for complete search history.

(56) References Cited

U.S. PATENT DOCUMENTS

| | | | |
|---|---|---|---|
| 2003/0164934 A1* | 9/2003 | Nishi | H01L 21/68 |
| | | | 355/75 |
| 2019/0163070 A1* | 5/2019 | Shang | G03F 7/70883 |
| 2021/0081811 A1* | 3/2021 | Brown | G05B 19/042 |
| 2022/0101198 A1* | 3/2022 | Freed | G06N 20/00 |

FOREIGN PATENT DOCUMENTS

| | | |
|---|---|---|
| CN | 108317701 A | 7/2018 |
| CN | 110095158 A | 8/2019 |
| CN | 210293277 U | 4/2020 |
| TW | M385685 U | 8/2010 |
| TW | 201835533 A | 10/2018 |
| TW | 201909131 A | 3/2019 |

\* cited by examiner

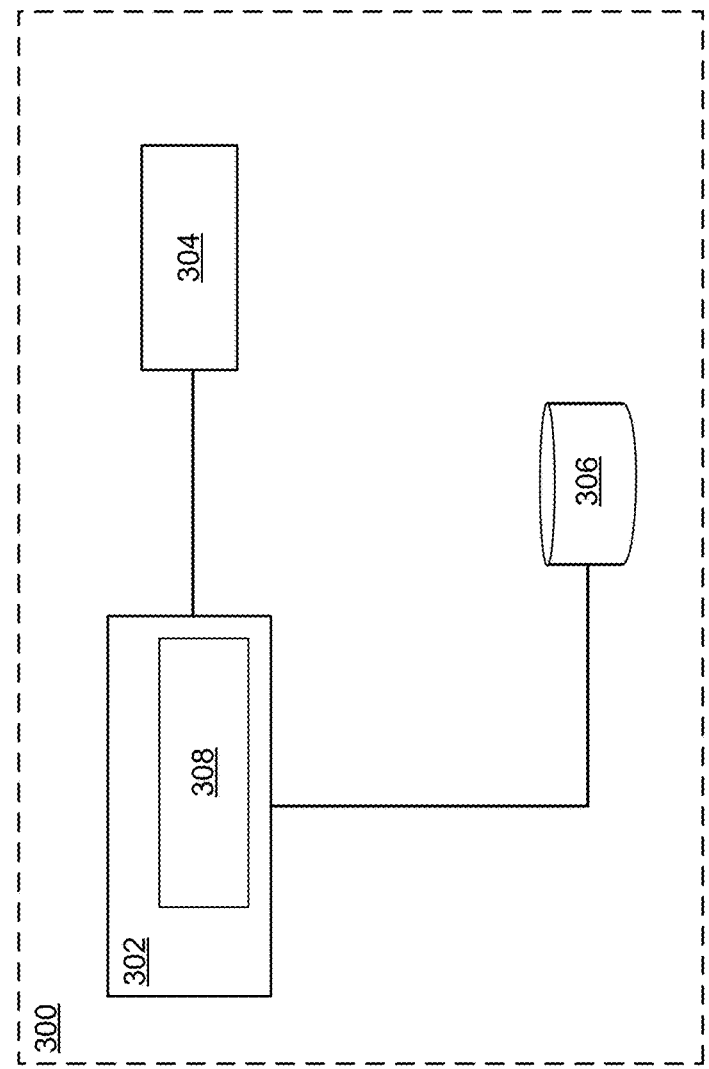

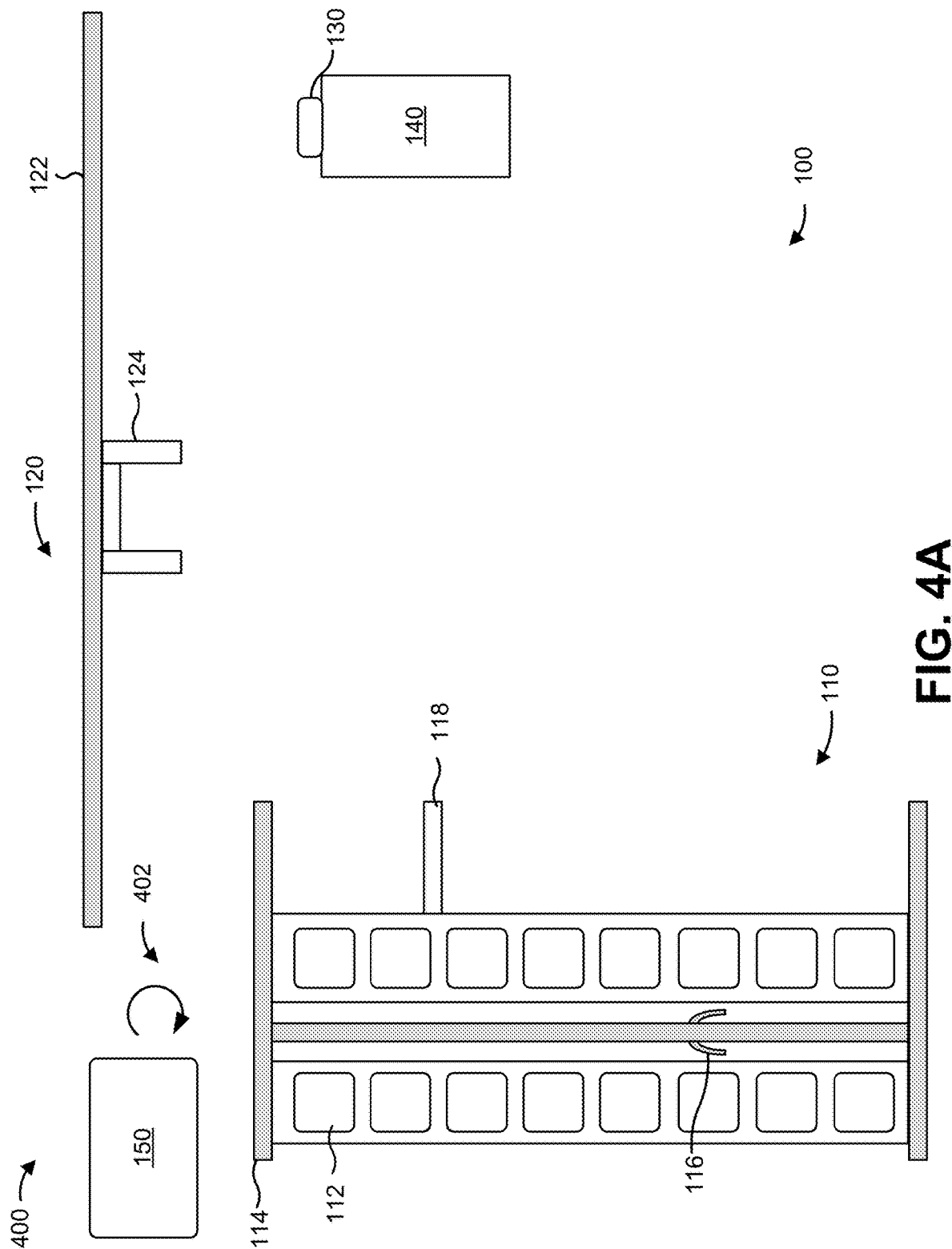

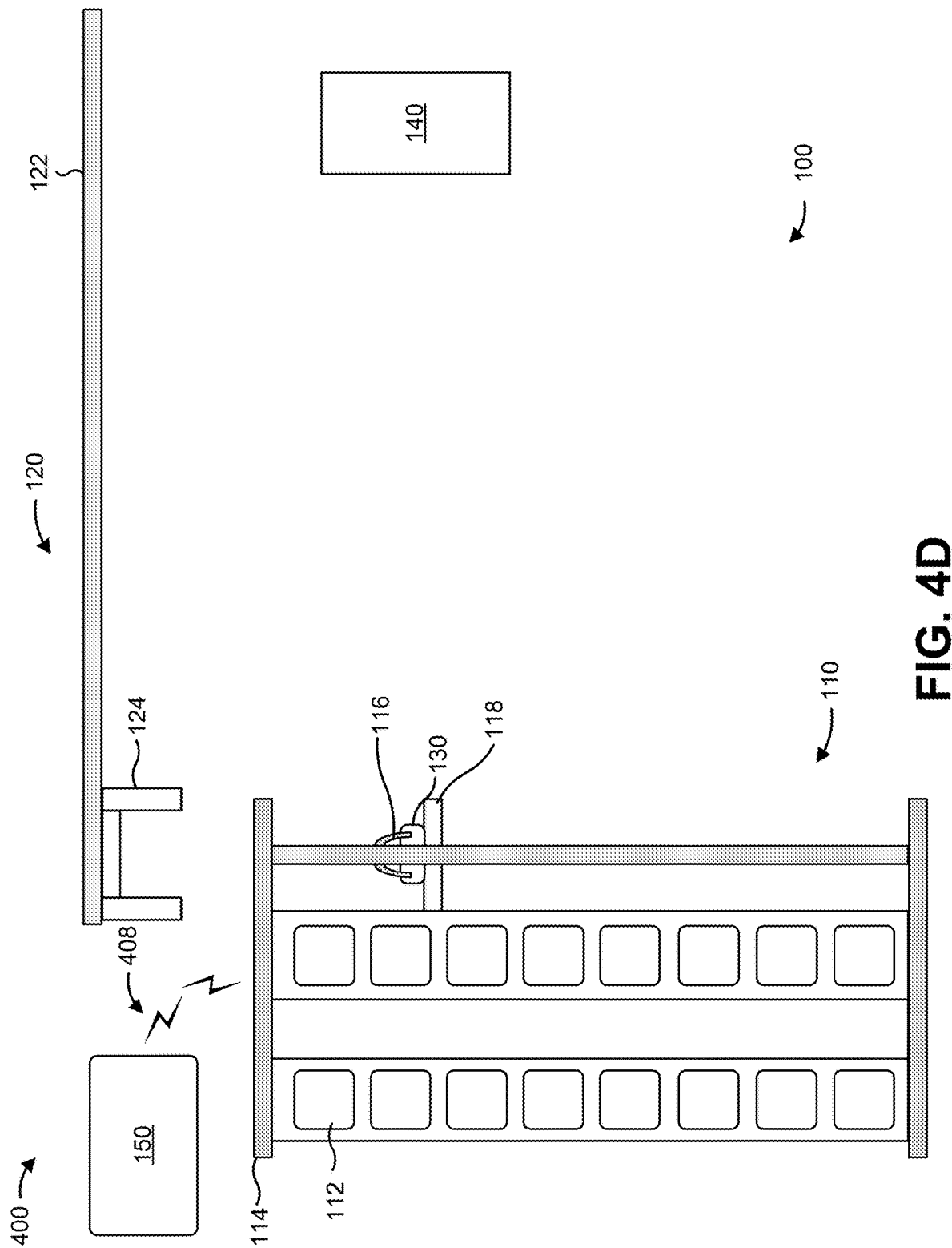

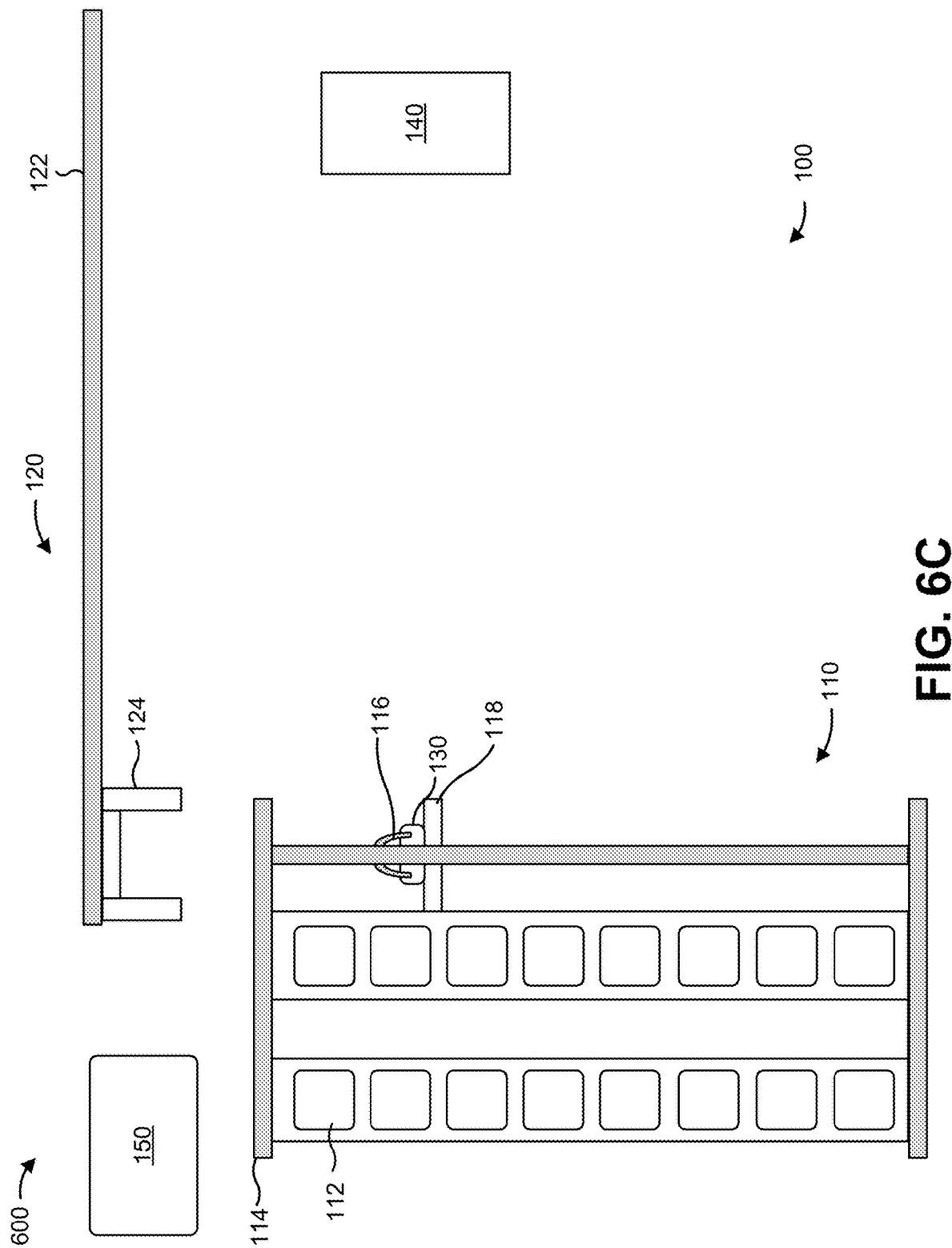

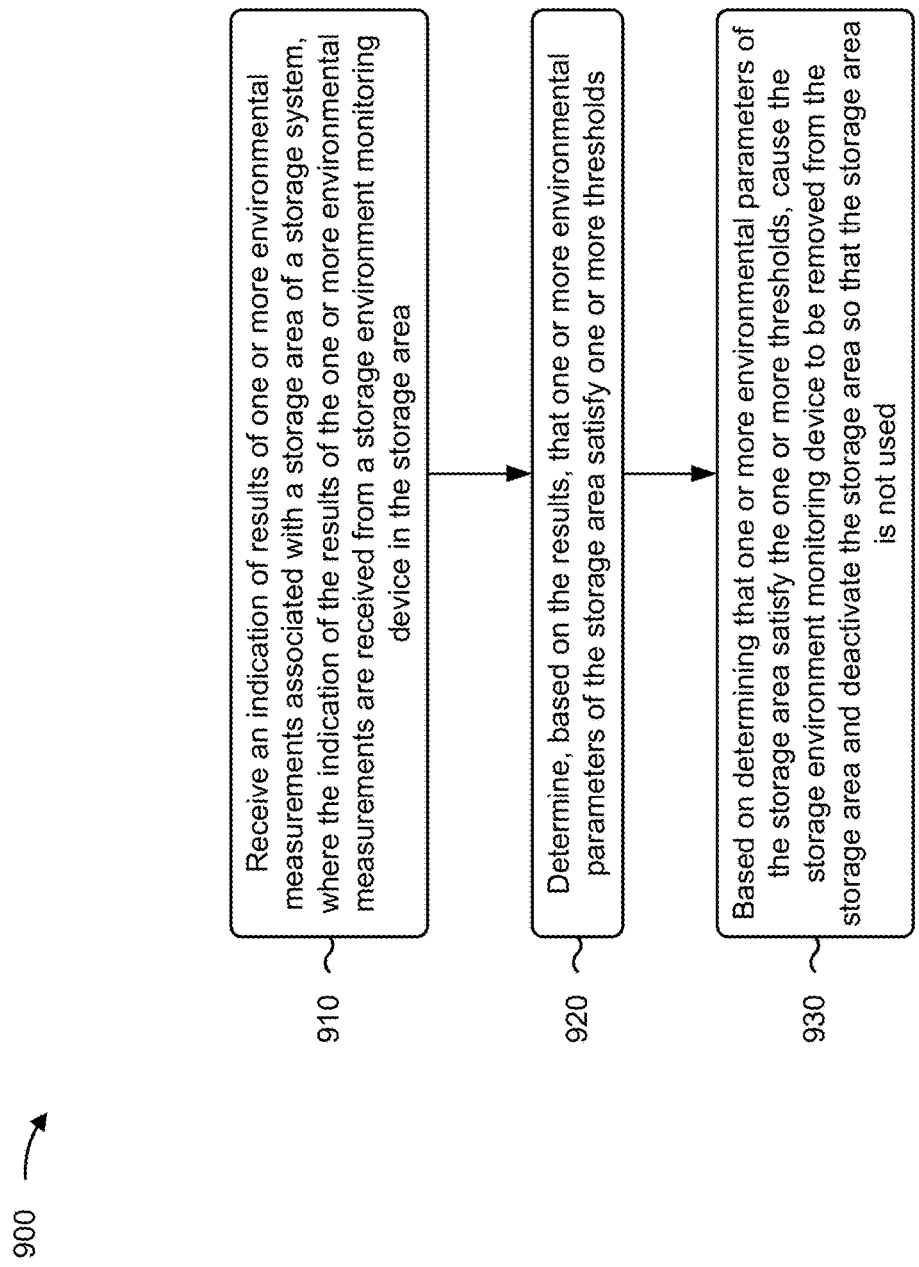

STORAGE ENVIRONMENT MONITORING SYSTEM AND METHODS OF OPERATION

BACKGROUND

A reticle (or photomask) may be used in a photolithography operation to form a pattern on a wafer or another type of semiconductor substrate. The pattern may be developed such that the pattern can be used to form semiconductor structures and/or devices on the wafer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3 is a diagram of an example control system of an environmental monitoring platform described herein for use in the example semiconductor storage environment of FIG. 1.

FIGS. 4A-4F, 5A-5D, and 6A-6D are diagrams of example implementations described herein.

FIGS. 8 and 9 are flowcharts of example processes relating to storage environment monitoring.

DETAILED DESCRIPTION

Figure 1:
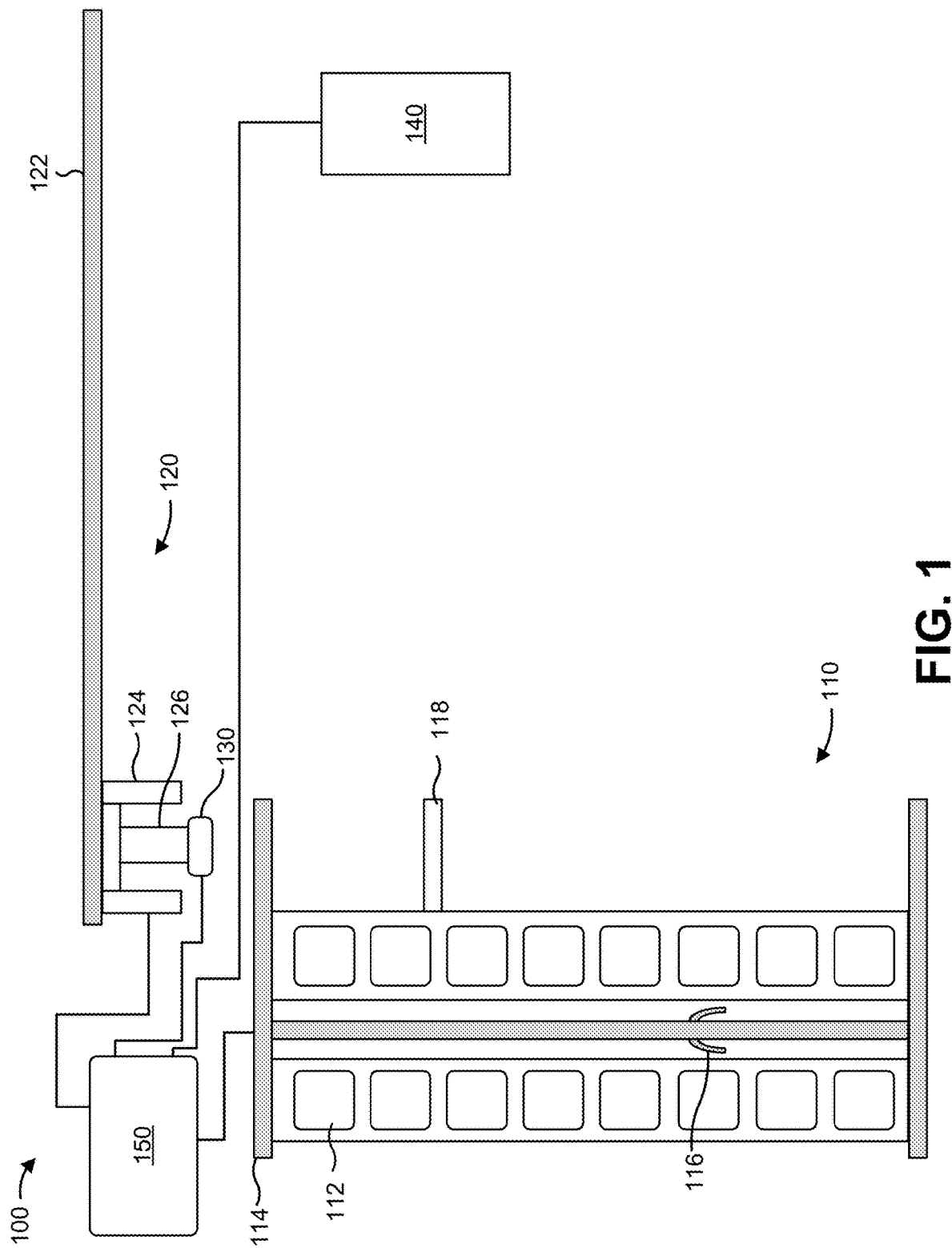
FIG. 1 is a diagram of an example semiconductor storage environment described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Defects may occur on a reticle (or photomask) due to improper storage, manufacturing imperfections, and/or other causes. A reticle defect can have significant impacts on semiconductor device manufacturing quality and yield, as any defects in a reticle might be repeatedly transferred to hundreds or thousands of semiconductor wafers.

Some implementations described herein provide techniques and apparatuses for storage environment monitoring. In some implementations, a storage environment monitoring device is capable of measuring and/or monitoring various parameters of an environment inside a storage area, such as airflow, temperature, and humidity, to increase the storage quality of semiconductor components (e.g., photolithography reticles, semiconductor wafers, and/or other components used in the manufacturing of semiconductor devices) stored in the storage area. The storage environment monitoring device is capable of measuring and/or monitoring the parameters of the environment inside the storage area without having to open an enclosure that is storing the semiconductor components in the storage area. This reduces exposure of the semiconductor components to contamination and other environmental factors that might otherwise result in reticle damage and/or defects, oxidation of semiconductor wafers, humidity damage to semiconductor wafers, among other examples. In addition, the storage environment monitoring device may perform automatic measurements inside the storage area based on usage schedules of the semiconductor components that are to be stored in the storage area, which decreases downtime of the storage area and/or the semiconductor components, and increases productivity in a semiconductor processing environment in which the semiconductor components are used.

The storage environment monitoring device may be implemented in various form factors to accommodate various use cases of the storage environment monitoring device. For example, the storage environment monitoring device may be configured to satisfy one or more semiconductor environment transport system form-factor parameters so that the storage environment monitoring device can be easily transported to various locations in a semiconductor processing environment in an automated manner. The storage environment monitoring device may be further capable of communicating environment parameter measurements to an environmental monitoring platform such that automated responses may be performed to maintain and increase storage quality and productivity in the semiconductor processing environment.

FIG. 1 is a diagram of an example semiconductor storage environment 100 described herein. The semiconductor storage environment 100 may be configured to store various types of semiconductor components, such as reticles or photomasks (e.g., in reticle storage carriers), semiconductor wafers (e.g., in standard mechanical interface (SMIF) carriers, front opening unified pods (FOUPs), and/or other types of wafer transport carriers), semiconductor processing materials, and/or other types of semiconductor processing equipment.

The semiconductor storage environment 100 may be associated with, and may be configured to operate in connection with, a semiconductor processing environment. The semiconductor processing environment may include a semiconductor foundry, a semiconductor fabrication facility, and/or a semiconductor clean room. The semiconductor processing environment may be configured to process semiconductor substrates, such as semiconductor wafers and/or semiconductor devices, using one or more semiconductor processing tools, such as an exposure tool (e.g., a deep ultraviolet (DUV) exposure tool, an extreme ultraviolet (EUV) exposure tool, a scanner, and/or a stepper), an etch tool, and/or another type of tool that performs semiconductor processing operations.

As shown in FIG. 1, the semiconductor storage environment 100 may include a storage system 110, a transport system 120, a storage environment monitoring device 130, a charging station 140, and an environmental monitoring platform 150, among other devices and/or systems. The storage system 110 may be a reticle storage system, a wafer storage system, or another type of semiconductor component storage system. The storage system 110 may include a storage rack or a storage enclosure that includes a plurality of storage areas 112. The storage areas 112 may be arranged in a grid in the storage system 110 such that the storage system 110 includes a plurality of horizontally adjacent columns of storage areas 112 and a plurality of vertically stacked rows of storage areas 112. Each storage area 112 may include a space that is configured to store and/or retain a carrier, such as a reticle carrier or a wafer transport carrier. The space within each storage area 112 may be environmentally-controlled and may be sealed from the external environment in the semiconductor storage environment 100 to reduce and/or prevent oxygen, humidity, and/or one or more other environmental elements from contaminating a reticle or a wafer stored therein.

Carriers may be transferred to and/or from a storage area 112 by a stocker 114 included in the storage system 110. The stocker 114 may include a crane 116 or another overhead transport device that is configured to retrieve a carrier from and/or place a carrier in a storage area 112. Moreover, the crane 116 may be configured to transport a carrier between a storage area 112 and a staging area 118 of the storage system 110. Alternatively, the stocker 114 may include another type of mechanism to transport carriers between a storage area 112 and the staging area 118 such as a robotic arm. The staging area 118 may provide a platform on which a carrier may be placed for transport to a storage area 112 and/or for retrieval by the transport system 120. In some implementations, the staging area 118 is referred to as a buffer area of the storage system 110.

The transport system 120 may include an automated material handling system (AMHS), an overhead hoist transport (OHT) system, a robotic arm, or another type of system that is configured to transport carriers to and/or from the storage system 110, to and/or from other locations in the semiconductor storage environment 100, and/or to and/or from the semiconductor processing environment. The transport system 120 may be a reticles carrier transport system (e.g., configured to transport reticle carriers), a wafer transport system (e.g., a transport system configured to transport wafer transport carriers), and/or another type of transport system configured to transport one or more other types of semiconductor components. Moreover, the transport system 120 may be configured to transport the storage environment monitoring device 130, as shown in FIG. 1. The transport system 120 may include an overhead track 122 that is configured to support an OHT vehicle 124 and to permit the OHT vehicle 124 to move within the semiconductor storage environment 100 and/or within the semiconductor processing environment along the overhead track 122. The overhead track 122 may include a guided rail and/or another type of track configured to allow guides, wheels, and/or rollers of the OHT vehicle 124 to move along the overhead track 122.

The OHT vehicle 124 may include a lift 126 that is configured to retrieve a carrier (or the storage environment monitoring device 130) and/or provide a carrier (or the storage environment monitoring device 130) to a location within the semiconductor storage environment 100 and/or within the semiconductor processing environment, such as the staging area 118 of the storage system 110, the charging station 140, and/or a load port associated with a semiconductor processing tool. The lift 126 may include a belt system, a pulley system, a hydraulic lift, and/or another type of lifting mechanism configured to selectively load (for example, by raising) a carrier (or the storage environment monitoring device 130) into the OHT vehicle 124 and unload (for example, by lowering) a carrier (or the storage environment monitoring device 130) from the OHT vehicle 124.

The storage environment monitoring device 130 may be configured to monitor and/or measure various environmental parameters of the environment within the storage areas 112 of the storage system 110. The storage environment monitoring device 130 may be configured to physically fit inside a storage area 112, may be configured to perform one or more types of environmental measurements of the environment in a storage area 112, may be configured to be transported by the stocker 114 between storage areas 112 and/or between a storage area 112 and the staging area 118, and/or may be configured to be transported by the transport system 120 between the storage system 110 and one or more other locations in the semiconductor storage environment 100, and/or between the semiconductor storage environment 100 and the semiconductor processing environment.

Moreover, the storage environment monitoring device 130 may be configured to be transported by the transport system between the storage system 110 and the charging station 140 so that the storage environment monitoring device 130 may be charged on the charging station 140. The charging station 140 may include a wireless charging station, a wired charging station, or another type of charging station that is configured to charge storage environment monitoring device 130 and/or one or more other types of devices in the semiconductor storage environment 100.

In some implementations, the environmental measurements that are capable of being performed by the storage environment monitoring device 130 include a humidity measurement associated with the environment of a storage area 112. The humidity measurement may include, for example, a measurement of a relative humidity level or another type of humidity level in a storage area 112. In some implementations, the environmental measurements that are capable of being performed by the storage environment monitoring device 130 include an airflow measurement associated with the environment of a storage area 112. The airflow measurement may include a measurement of an airflow rate, an airflow volume, and/or an airflow speed into and/or out of the storage area 112.

In some implementations, the environmental measurements that are capable of being performed by the storage environment monitoring device 130 include an oxygen concentration measurement associated with the environment of a storage area 112. In some implementations, the environmental measurements that are capable of being performed by the storage environment monitoring device 130 include a pressure measurement associated with the environment of a storage area 112. The pressure measurement may include a measurement of static pressure within the storage area 112, a measurement of differential pressure within the storage area 112, and/or another type of pressure measurement. In some implementations, the environmental measurements that are capable of being performed by the storage environment monitoring device 130 include a temperature measurement associated with the environment of a storage area 112 (e.g., a measurement of the temperature within the storage area 112). While particular environmental measurements have been identified above, the above-identified environmental measurements are simply examples. In practice, the storage environment monitoring device 130 may perform any single one of the above-identified environmental measurements, any combination of the above-identified environmental measurements, or one or more other types of environmental measurements either alone or in combination with one or more of the above-identified environmental measurements.

The environmental monitoring platform 150 may be configured to communicate with various systems and/or devices in the semiconductor storage environment 100, may be configured to monitor and/or maintain the environmental parameters of the storage areas 112, and/or may perform one or more other actions associated with the semiconductor storage environment 100. In some implementations, the environmental monitoring platform 150 includes a personal computer, a workstation computer, a laptop, a server device, or another type of computation and/or communication device. In some implementations, the environmental monitoring platform 150 includes a cloud-based platform that is hosted in a cloud computing environment or a data center. In some implementations, the environmental monitoring platform 150 may perform operations for multiple semiconductor storage environments, such as the semiconductor storage environment 100 and one or more separate the semiconductor storage environments. In some implementations, the environmental monitoring platform 150 may be included as part of the storage system 110. In these implementations, the environmental monitoring platform 150 may be included in and/or may be implemented by a stocker controller of the storage system 110.

The environmental monitoring platform 150 may communicate with the stocker 114, the OHT vehicle 124, the storage environment monitoring device 130, and/or the charging station 140 over wired and/or wireless connections. The environmental monitoring platform 150 may provide and/or may receive signals, indications, data, and/or other types of information over wired and/or wireless connections. As an example, the environmental monitoring platform 150 may provide signals to the OHT vehicle 124 to retrieve a carrier or the storage environment monitoring device 130 from a location in the semiconductor storage environment 100 (e.g., from the charging station 140 or from the staging area 118) and/or to provide a carrier or the storage environment monitoring device 130 to a location in the semiconductor storage environment 100 (e.g., to the charging station 140 or to the staging area 118). As another example, the environmental monitoring platform 150 may provide signals to the stocker 114 to retrieve a carrier or the storage environment monitoring device 130 from a storage area 112 or the staging area 118 and/or to provide a carrier or the storage environment monitoring device 130 to a storage area 112 or the staging area 118.

As another example, the environmental monitoring platform 150 may communicate with the charging station 140 to receive an indication of a charging status of the storage environment monitoring device 130, which may include an indication of remaining battery life of the storage environment monitoring device 130 and/or an indication of an estimated time to charging completion for the storage environment monitoring device 130. As another example, the environmental monitoring platform 150 may communicate with the storage environment monitoring device 130 to cause the storage environment monitoring device 130 to perform one or more environmental measurements of a storage area 112, to cause the storage environment monitoring device 130 to provide results of the one or more environmental measurements to the environmental monitoring platform 150, and/or to cause the storage environment monitoring device 130 to provide a battery level indication of the storage environment monitoring device 130. The battery level indication may include an indication of an estimated remaining battery life represented as a percentage, a remaining amount of operation time, and/or another battery life indicator.

The environmental monitoring platform 150 may be configured to monitor environmental parameters of a storage area 112 based on results of environmental measurements for the storage area 112 (e.g., received from the storage environment monitoring device 130). In some implementations, the environmental monitoring platform 150 is configured to determine whether a humidity parameter (e.g., a relative humidity) of a storage area 112 satisfies (e.g., exceeds) a humidity threshold configured for the storage system 110. An example humidity threshold may include 10% relative humidity in a storage area 112, as humidity levels greater than 10% relative humidity may cause moisture damage to reticles and/or wafers stored in the storage area 112. However, other humidity thresholds are within the scope of the present disclosure.

In some implementations, the environmental monitoring platform 150 is configured to determine whether a temperature parameter of a storage area 112 satisfies (e.g., exceeds or is below) one or more temperature thresholds configured for the storage system 110. An example upper temperature threshold may include 23 degrees Celsius, and an example lower temperature threshold may include 21 degrees Celsius, as reticles and/or wafers may be susceptible to expansion and/or contraction at higher or lower temperatures. However, other temperature thresholds are within the scope of the present disclosure.

In some implementations, the environmental monitoring platform 150 is configured to determine whether an airflow parameter of a storage area 112 satisfies (e.g., exceeds or is below) one or more airflow thresholds configured for the storage system 110. An example upper airflow threshold may include a 16 liters per minute flow rate, and an example lower airflow threshold may include a 10 liters per minute flow rate, as greater or lesser flow rates may result in decreased contaminant removal performance or air turbulence in the storage area 112. However, other airflow thresholds are within the scope of the present disclosure.

The environmental monitoring platform 150 may be configured to transmit signals to the storage system 110 and/or the stocker 114 to automatically cause one or more actions to be performed based on determining abnormal storage environment conditions in a storage area 112. The environmental monitoring platform 150 may determine storage environment conditions in a storage area 112 are abnormal based on determining that one or more of the above-described environmental parameters for the storage area 112 satisfy the associated thresholds. In some implementations and based on determining that storage environment conditions in the storage area 112 are abnormal, the environmental monitoring platform 150 may transmit a signal to the stocker 114 to automatically cause the stocker 114 to remove a carrier or the storage environment monitoring device 130 from the storage area 112. The stocker 114 may transfer the carrier or the storage environment monitoring device 130 to another storage area 112 or to the staging area 118 based on receiving the signal from the environmental monitoring platform 150. In some implementations, the environmental monitoring platform 150 may transmit a signal to the storage system 110 to automatically deactivate or lock the storage area 112 so that the storage area 112 is not used to store carriers (e.g., until after the abnormal storage environment conditions in the storage area 112 are rectified).

In some implementations, environmental monitoring platform 150 may transmit one or more signals to the storage system 110 to automatically adjust one or more environmental parameters of the storage area 112 (or to automatically cause the one or more environmental parameters to be adjusted). For example, the environmental monitoring platform 150 may transmit a signal to the storage system 110 to automatically adjust (e.g., increase or decrease) a flow rate of air into the storage area 112 such that the airflow parameter for the storage area 112 satisfies the one or more airflow thresholds and/or such that the pressure parameter for the storage area 112 satisfies a pressure threshold. As another example, the environmental monitoring platform 150 may transmit a signal to the storage system 110 to cause the storage system 110 to automatically clean or replace an air filter associated with the storage area 112, as a dirty air filter may be causing the flow rate into the storage area 112 to satisfy the airflow threshold and/or the pressure threshold.

As another example, the environmental monitoring platform 150 may transmit a signal to the storage system 110 to automatically adjust an temperature control system of the storage system 110 to increase or decrease the temperature in the storage area 112 such that the temperature parameter for the storage area 112 satisfies the one or more temperature thresholds. As another example, the environmental monitoring platform 150 may transmit a signal to the storage system 110 to automatically adjust the humidity of the incoming air into the storage area 112 to decrease the relative humidity in the storage area 112 such that the humidity parameter for the storage area 112 satisfies the humidity threshold.

The number and arrangement of components shown in FIG. 1 are provided as an example. The semiconductor storage environment 100 may include additional components, fewer components, different components, or differently arranged components than those shown in FIG. 1. Additionally, or alternatively, a set of components (e.g., one or more components) of the semiconductor storage environment 100 may perform one or more functions described as being performed by another set of components of the semiconductor storage environment 100.

Figure 2A:
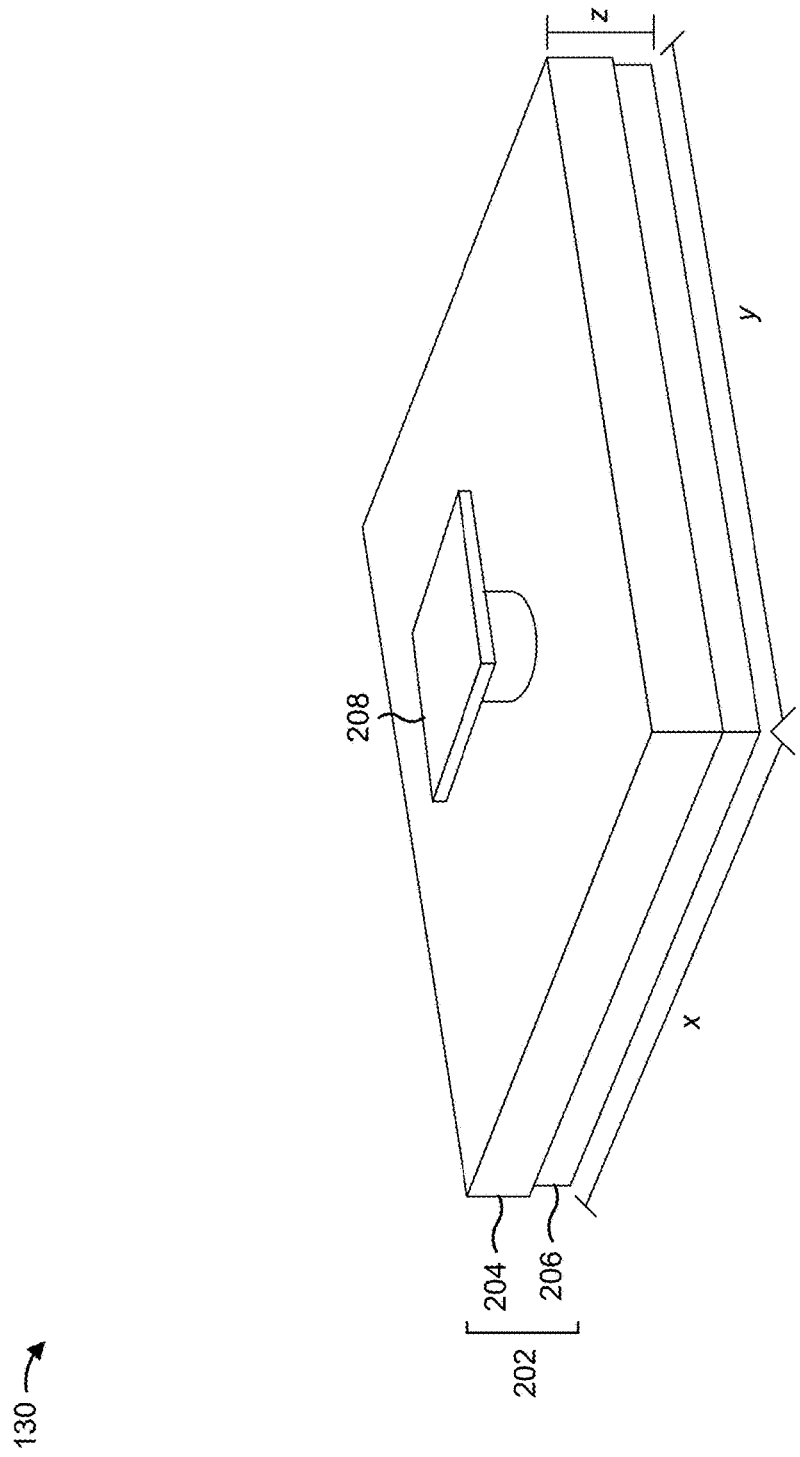
FIGS. 2A-2C are diagrams of an example storage environment monitoring device described herein for use in the example semiconductor storage environment of FIG. 1.
Figure 2B:
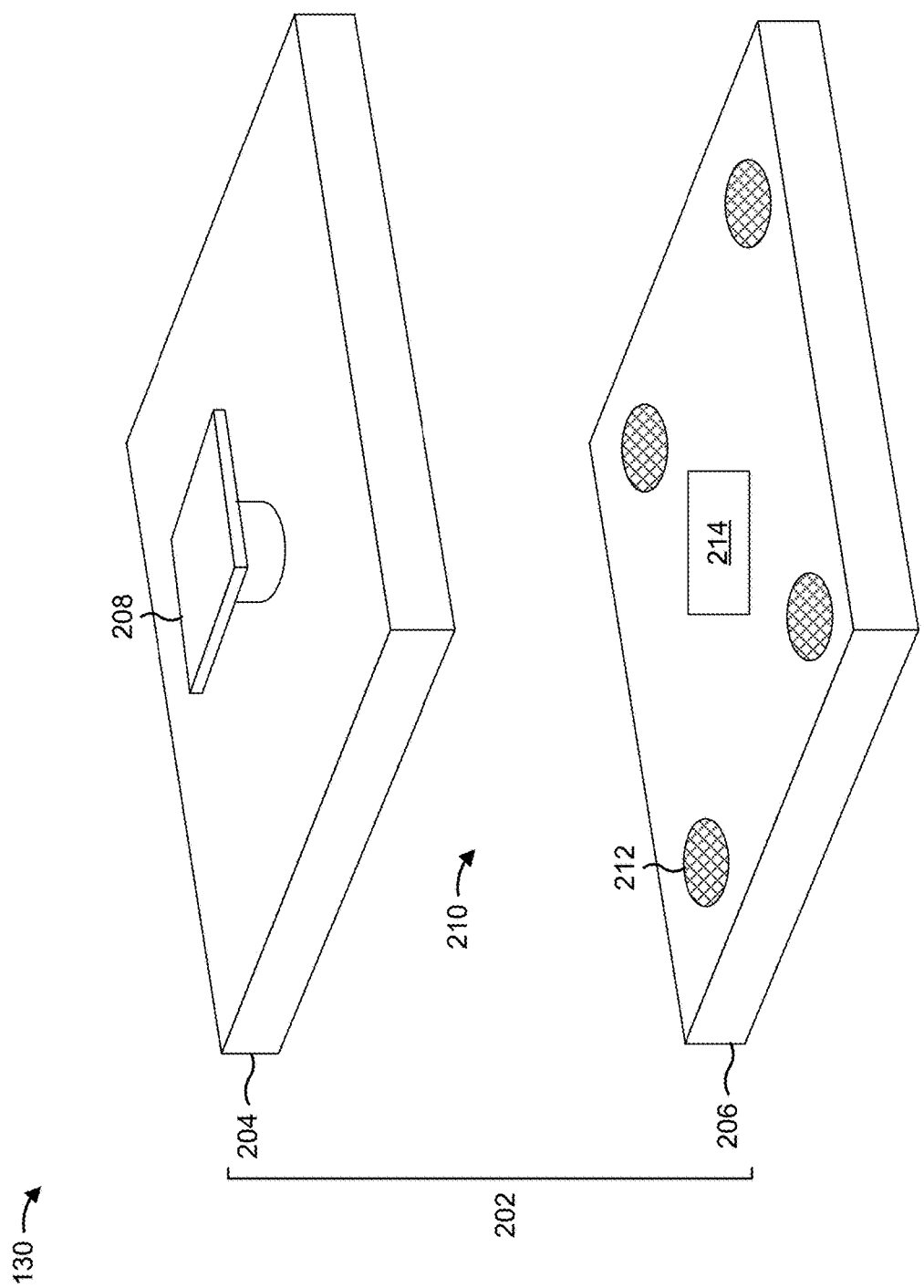
Figure 2C:
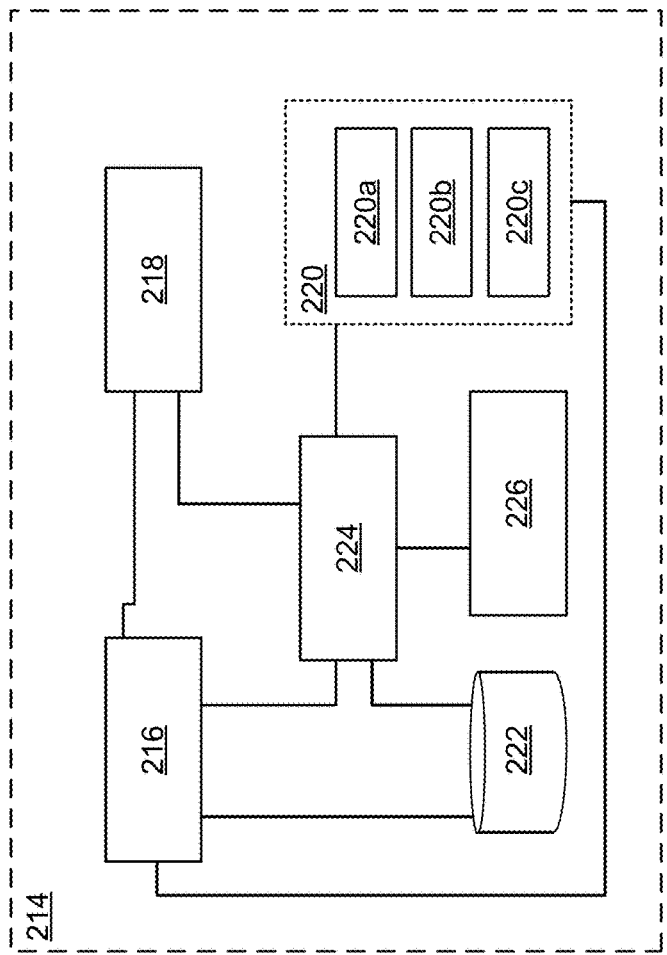

FIGS. 2A-2C are diagrams of the storage environment monitoring device 130 described herein for use in the semiconductor storage environment 100 of FIG. 1. FIG. 2A is a perspective of an example physical structure of the storage environment monitoring device 130. The physical structure, or form factor, of the storage environment monitoring device 130 may be configured substantially similar to the physical structure or form factor of a reticle carrier, a wafer transport carrier, or another type of carrier that is configured to store and transport semiconductor components. As an example, and as shown in FIG. 2A, the physical structure or form factor of the storage environment monitoring device 130 may approximately conform to the physical structure or form factor of a reticle carrier. In some implementations, a reticle carrier may be repurposed as the storage environment monitoring device 130 in that the reticle carrier may be retrofitted with the components of the storage environment monitoring device 130 and used for the dedicated purpose of measuring and monitoring the environment in the storage areas 112 of the storage system 110.

As shown in FIG. 2A, the storage environment monitoring device 130 may include a housing 202 that includes an upper shell 204 and a lower shell 206. FIG. 2A illustrates an assembled configuration of the housing 202, in which the upper shell 204 is mated or coupled with the lower shell 206. An OHT head 208 may be included on a top portion of the upper shell 204 to permit the storage environment monitoring device 130 to be transported by the OHT vehicle 124 and/or the stocker 114 in a manner similar to the transport of a reticle carrier or a wafer transport carrier. In particular, the lift 126 of the OHT vehicle 124 may latch onto the OHT head 208 to load the storage environment monitoring device 130 into the OHT vehicle 124 and to secure the storage environment monitoring device 130 while the storage environment monitoring device 130 is transported in the OHT vehicle 124, and may unlatch from the OHT head 208 to provide the storage environment monitoring device 130 to a location such as the staging area 118 or the charging station 140.

As indicated above, the physical structure or form factor of the storage environment monitoring device 130 may approximately conform to the physical structure or form factor of a reticle carrier. In this way, the storage environment monitoring device 130 is capable of being placed in a storage area 112 and transported in the OHT vehicle 124 in a similar manner as a reticle carrier to permit automated operation and transport of the storage environment monitoring device 130 without any adjustments or re-engineering of the other components of the semiconductor storage environment 100 to accommodate the form factor of the environment monitoring device 130. Accordingly, one or more of the dimensions of the storage environment monitoring device 130 may be configured to conform to corresponding dimensions of reticle carriers used in the semiconductor storage environment 100 and/or may be configured to satisfy one or more standardized reticle carrier dimensional parameters. The one or more standardized reticle carrier dimensional parameters may include one or more parameters of a reticle carrier specification, such as SEMI E100, SEMI E111, and/or SEMI E112.

In some implementations, the one or more dimensions include external dimensions of the storage environment monitoring device 130, such as a length dimension (the x dimension in FIG. 2A), a width dimension (they dimension in FIG. 2A), and/or a height dimension (the z dimension in FIG. 2A). The external dimensions may be based on a reticle carrier that is configured to store and transport reticles of a particular size, such as 6 inch reticles, 150 millimeter reticles, or 230 millimeter reticles, among other examples. An example range for the length dimension (the x dimension in FIG. 2A) may include approximately 175 millimeters to approximately 300 millimeters. An example range for the width dimension (they dimension in FIG. 2A) may include approximately 150 millimeters to approximately 230 millimeters. An example range for the height dimension (the z dimension in FIG. 2A) may include approximately 26 millimeters to approximately 100 millimeters.

FIG. 2B illustrates an exploded configuration of housing 202 in which the upper shell 204 and the lower shell 206 are separated to expose an internal space 210 of the storage environment monitoring device 130. The upper shell 204 and the lower shell 206 may be configured to form and enclose the internal space 210 when the upper shell 204 and the lower shell 206 are coupled. One or more ports 212 (or openings) may be included through the housing 202 to permit the internal space 210 to be exposed to an environment of a storage area 112 in which the storage environment monitoring device 130 is located. This permits a control system 214 included in the internal space 210 of the storage environment monitoring device 130 to measure and/or monitor the environment of the storage area 112. The one or more ports 212 may be included through the lower shell 206 (as shown in FIG. 2B) and/or through the upper shell 204. The size (e.g., diameter) of the ports 212, the spacing between ports 212, and/or the distance between the ports 212 and the edges of the upper shell 204 or the lower shell 206 may be similar to and/or specified in one or more of the SEMI specifications listed above.

FIG. 2C illustrates a diagram of the control system 214. As indicated above, the control system 214 of the storage environment monitoring device 130 may be included in the housing 202. Alternatively, the storage environment monitoring device 130 may be included in and/or on a reticle carrier (or another type of carrier) such that the reticle carrier is configured to transport reticles and perform the storage environment measurement and/or monitoring of the storage environment monitoring device 130 described herein. In these examples, the control system 214 of the storage environment monitoring device 130 may be integrated into the reticle carrier (e.g., such that the reticle carrier and the storage environment monitoring device 130 are a unified device), or the control system 214 is packaged into a standalone device such that the storage environment monitoring device 130 may be removably secured to the reticle carrier.

As shown in FIG. 2C, the control system 214 may include a processor 216, a communication interface 218, one or more sensors 220 (e.g., sensors 220a-220c), a data structure 222, a battery 224, and a charging device 226.

The one or more sensors 220 may be configured to perform one or more measurements associated with the environment of the storage area 112 in which the storage environment monitoring device 130 is located, and to generate environmental measurement data based on results of the one or more measurements. The environmental measurement data may include, for example, a voltage, a current, a capacitance, a digital signal, an analog signal, and/or another type of data that represents the results of the one or more measurements. For example, the one or more sensors 220 may include a temperature sensor configured to perform temperature measurements associated with the environment of the storage area 112 and to generate environmental measurement data representing results of the temperature measurements. As another example, the one or more sensors 220 may include a pressure sensor configured to perform pressure measurements associated with the environment of the storage area 112 and to generate environmental measurement data representing results of the pressure measurements. As another example, the one or more sensors 220 may include a humidity sensor configured to perform humidity measurements associated with the environment of the storage area 112 and to generate environmental measurement data representing results of the humidity measurements. As another example, the one or more sensors 220 may include an airflow sensor configured to perform airflow measurements associated with the environment of the storage area 112 and to generate environmental measurement data representing results of the airflow measurements.

The processor 216 may be configured to receive the environmental measurement data from the one or more sensors 220. The processor 216 may be configured to store the environmental measurement data in the data structure 222 and/or to provide the environmental measurement data to the communication interface 218 for transmission to the environmental monitoring platform 150. The processor 216 may further be configured to determine, based on the environmental measurement data representing the results of the one or more measurements, that one or more parameters of the environment of the storage area 112 satisfy one or more thresholds such as one or more of the thresholds described above in connection with FIG. 1. The processor 216 may generate, based on determining that the one or more parameters of the environment of the storage area 112 satisfy the one or more thresholds, one or more alerts associated with the storage area 112. The one or more alerts may include an alert that the one or more thresholds are satisfied, may include an alert that abnormal storage environment conditions are present in the storage area 112, and/or may include an indication of one or more proposed actions that may be performed to rectify the abnormal storage environment conditions, among other examples.

The communication interface 218 may include a wireless interface such as a Bluetooth interface, a Wi-Fi interface, a Wi-Fi direct interface, a cellular interface, and/or another type of wireless interface that is configured to wirelessly communicate with the environmental monitoring platform 150 so that the storage environment monitoring device 130 may move freely throughout the semiconductor storage environment 100 (e.g., without being attached to a wired communication connection). For example, the communication interface 218 may receive a signal from the environmental monitoring platform 150 to cause the storage environment monitoring device 130 to perform the one or more measurements, may transmit the environmental measurement data based on the one or more measurements, and/or may transmit the one or more alerts to the environmental monitoring platform 150. Moreover, the communication interface 218 may be configured to transmit an indication of a remaining battery life of the battery 224 to the environmental monitoring platform 150 so that the environmental monitoring platform 150 may determine when to dispatch the storage environment monitoring device 130 to the charging station 140 for charging the battery 224.

The data structure 222 may include a memory device, a storage device, a file system, a database, an electronic file, and/or another type of data structure configured to store environmental measurement data prior to transmission to the environmental monitoring platform 150. The battery 224 may be configured to power the control system 214 and/or other components of the storage environment monitoring device 130 so that the storage environment monitoring device 130 may move freely throughout the semiconductor storage environment 100 (e.g., without being attached to an external power source). The charging device 226 may be configured to interface with the charging station 140 to wirelessly charge the battery 224 and/or to charge the battery 224 through a wired connection when the storage environment monitoring device 130 is placed on the charging station 140.

As indicated above, FIGS. 2A-2C are provided as one or more examples. Other examples may differ from what is described with regard to FIGS. 2A-2C.

FIG. 3 is a diagram of an example control system 300 of the environmental monitoring platform 150 described herein for use in the example semiconductor storage environment 100 of FIG. 1. As shown in FIG. 3, the control system 300 of the environmental monitoring platform 150 may include a processor 302, a communication interface 304, a data structure 306, among other components.

The processor 302 may be configured to determine whether to dispatch the storage environment monitoring device 130 to the storage system 110 to perform one or more environmental measurements of one or more storage areas 112 included in the storage system 110. The processor 302 may be configured to generate various signals. In some implementations, the signals include a signal to cause the OHT vehicle 124 of the transport system 120 to transport the storage environment monitoring device 130 between the storage system 110 and the charging station 140. In some implementations, the signals include a signal to cause the stocker 114 to transport storage environment monitoring device 130 between the staging area 118 of the storage system 110 and a storage area 112 of the storage system 110. In some implementations, the signals include a signal to cause the stocker 114 to transfer the storage environment monitoring device 130 between storage areas 112 of the storage system 110.

In some implementations, the processor 302 is configured to generate signals to cause the storage environment monitoring device 130 to perform the one or more measurements. The processor 302 may be configured to store results of the one or more measurements in the data structure 306. The communication interface 304 may include a wireless interface such as a Bluetooth interface, a Wi-Fi interface, a Wi-Fi direct interface, a cellular interface, and/or another type of wireless interface that is configured to wirelessly communicate with the storage environment monitoring device 130 to receive an indication of the one or more measurements, an indication of a remaining battery life of the storage environment monitoring device 130, and/or another indication. The data structure 306 may include a memory device, a storage device, a file system, a database, an electronic file, and/or another type of data structure configured to store the results of environmental measurements received from the storage environment monitoring device 130.

The processor 302 may be configured to determine, based on results of environmental measurements received from the storage environment monitoring device 130, whether one or more environmental parameters of an associated storage area 112 satisfy one or more thresholds. Additionally and/or alternatively, the processor 302 may use various data processing techniques, such as big data mining, machine learning, and/or neural network processing, to determine and/or identify trends in environmental parameters of a storage area 112 so that proactive action can be taken before an abnormal storage environment condition occurs in the storage area 112. In some implementations, the processor 302 uses big data mining to collect and store (e.g., in the data structure 306) historical results of thousands, tens of thousands, or more environmental measurements of the storage area 112 and other storage areas 112 in the storage system 110. Moreover, the processor 302 may collect and store historical outcomes of actions that were performed based on the historical results. The historical outcomes may indicate whether the actions were successful or unsuccessful, whether the actions improved the environmental conditions in the storage areas 112, or the like. The processor 302 may structure the historical environmental measurement results and/or the historical outcomes (e.g., if received as unstructured data) using various data structuring techniques (e.g., tagging, generating metadata, categorizing, and/or one or more other techniques). The information in the data structure 306 may be continuously and/or periodically updated as additional environmental measurements and associated outcomes becomes available.

In some implementations, the processor 302 uses machine learning and/or neural network processing for decision making when determining whether to automatically perform one or more actions to mitigate deteriorating environmental conditions in a storage area 112. Machine learning involves computers learning from data to perform tasks and/or to make decisions. Machine learning algorithms are used to train machine learning models based on sample data, known as "training data." Once trained, machine learning models may be used to make predictions, decisions, or classifications relating to new observations. Here, the processor 302 may train a machine learning model 308 on the historical environmental measurement results, the actions that were performed, and/or the associated historical outcomes. Alternatively, a separate device (e.g., a server device) may train the machine learning model and may provide the trained machine learning model 308 for use by the processor 302.

The machine learning model may be trained on the data from thousands (or more) of historical environmental measurement results, actions, and/or historical outcomes using a supervised learning technique and/or an unsupervised learning technique. In some implementations, the processor 302 trains a regression model, a decision tree model, a Naïve Bayes classifier, a k nearest neighbor (KNN) model, or another type of supervised machine learning model by specifying a target or outcome variable that is to be predicted from an independent set of variables. In some implementations, the processor 302 uses a neural network (e.g., an artificial neural network that includes thousands or millions (or more) of artificial neurons or processing nodes) to train the machine learning model 308 using a deep learning technique. The nodes in the neural network may be layered and weighted. A node in a layer of the neural network may be connected to a plurality of nodes in a lower layer of the neural network, and may receive a weight from each of the nodes in the lower layer. The node may update the weights and feed forward a weight to one or more nodes in a higher layer in the neural network if the weight satisfies a threshold (which may be referred to as a "firing" of the node). The weights in the neural network may be adjusted and/or updated as the neural network continues to process the training data provided to the machine learning model 308 until similar training data parameters yield similar weights through the neural network.

In some implementations, the processor 302 uses the machine learning model 308 to generate a linear regression of inputs (e.g., the historical environmental measurement results) to determine and/or identify trends in the historical environmental measurement results. In this way, the processor 302 may use the determined and/or identified trends to determine whether and/or when an abnormal storage environment condition is likely to occur. In some implementations, the processor 302 uses the machine learning model 308 to generate a function that maps inputs to the machine learning model 308 (e.g., historical environmental measurement results, historical actions, historical outcomes, and/or one or more proposed actions for a particular storage area 112) to specified outputs from the machine learning model (e.g., a specified outcome for the one or more proposed actions). In this way, the processor 302 uses the function (e.g., determined by the machine learning model 308) to determine a likelihood or a probability that the one or more proposed actions will result in the specified outcome.

The processor 302 may receive, from the storage environment monitoring device 130, an indication of results of one or more environmental measurements associated with a storage area 112, may determine, using the machine learning model 308 and based on the results, that one or more environmental parameters of the storage area 112 are estimated to satisfy one or more thresholds, and may automatically perform one or more actions associated with the storage area 112 based on determining that one or more environmental parameters of the storage area 112 are estimated to satisfy the one or more thresholds. Moreover, the processor 302 may store the results in the data structure 306 along with historical results of one or more historical environmental measurements associated with the storage system 110, may store outcomes of the one or more actions along with historical outcomes of one or more historical actions in the data structure 306, and may update the machine learning model 308 based on the results, the historical results, the outcomes and the historical outcomes to further train and refine the machine learning model 308 (which may increase the performance and accuracy of the machine learning model 308.

As indicated above, FIG. 3 is provided as an example. Other examples may differ from what is described with regard to FIG. 3.

FIGS. 4A-4F are diagrams of an example implementation 400 described herein. The example implementation 400 may be an example implementation of storage environment monitoring in a semiconductor storage environment such as the semiconductor storage environment 100. In particular, the example implementation 400 may be an example implementation of dispatching the storage environment monitoring device 130 to perform one or more environmental measurements associated with one or more storage areas 112 of the storage system 110.

As shown in FIG. 4A, and by reference number 402, the environmental monitoring platform 150 may determine (e.g., using the processor 302 of the control system 300) to dispatch the storage environment monitoring device 130 to the storage system 110 to perform one or more environmental measurements of one or more storage areas 112 included in the storage system 110. In some implementations, the environmental monitoring platform 150 determines to dispatch the storage environment monitoring device 130 to perform the one or more environmental measurements based on a measurement schedule for the storage system 110. In some implementations, the environmental monitoring platform 150 determines to dispatch the storage environment monitoring device 130 to perform the one or more environmental measurements based on configured usage schedules for reticles, wafers, and/or other semiconductor components that are to be stored in the one or more storage areas 112. As an example, the environmental monitoring platform 150 may determine to dispatch the storage environment monitoring device 130 to perform the one or more environmental measurements at a time during which the reticles, wafers, and/or other semiconductor components are scheduled to be in use (e.g., in a semiconductor processing environment) to reduce or minimize the productivity impact of performing the one or more environmental measurements.

In some implementations, the environmental monitoring platform 150 determines to dispatch the storage environment monitoring device 130 to perform the one or more environmental measurements based on results of historical environmental measurements for the one or more storage areas 112 (e.g., results of historical environmental measurements stored in the data structure 306). For example, the environmental monitoring platform 150 may determine (e.g., using the machine learning model 308 of the control system 300) that one or more environmental parameters of the one or more storage areas 112 are trending toward and/or are estimated to exceed one or more associated thresholds. In this way, the environmental monitoring platform 150 may dispatch the storage environment monitoring device 130 more frequently to more closely monitor the environment in the one or more storage areas 112 to identify environmental issues before they occur, which can reduce or prevent downtime.

Figure 4B:
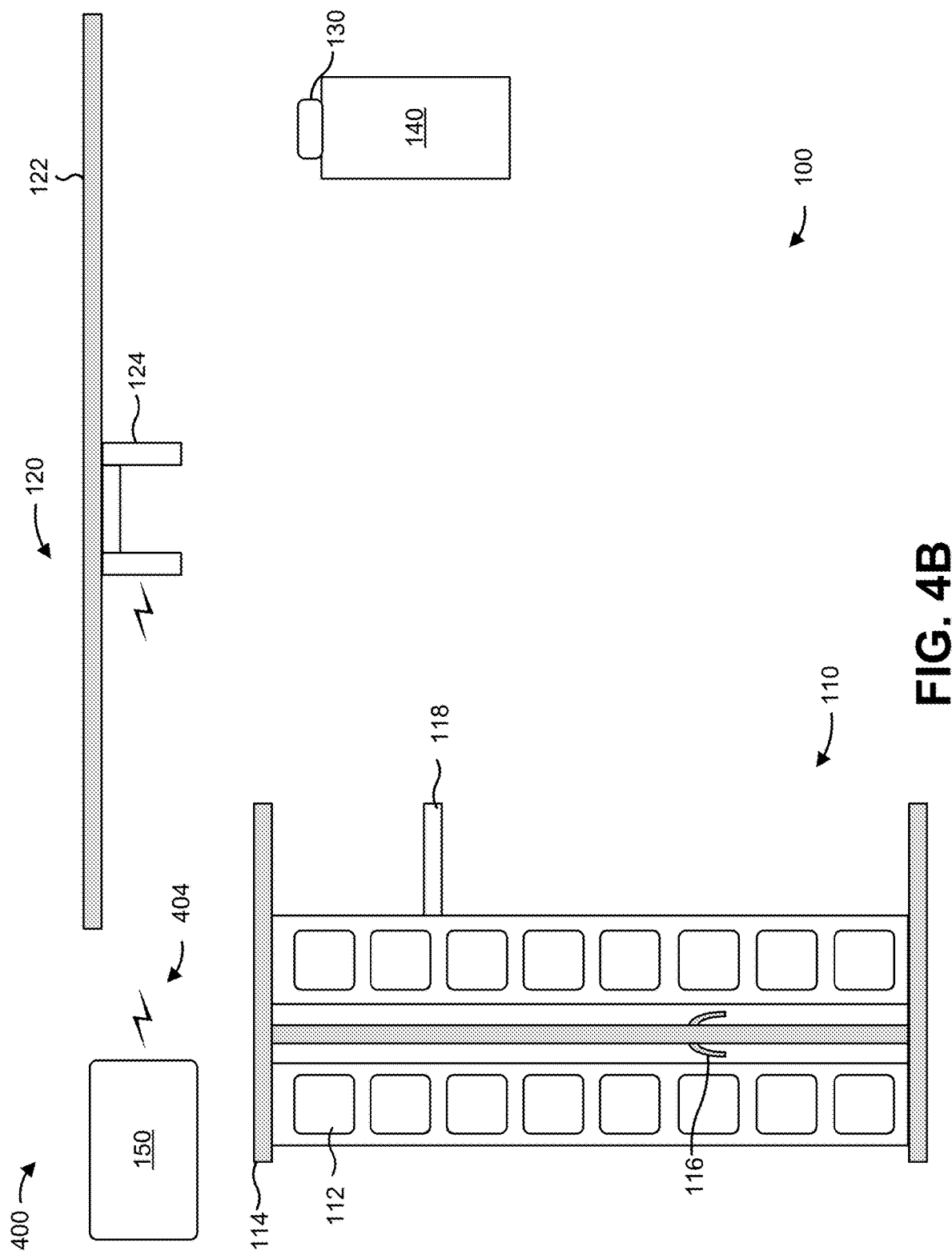

As shown in FIG. 4B, the environmental monitoring platform 150 may transmit (e.g., using the communication interface 304 of the control system 300) a first signal 404 to transport system 120 to retrieve the storage environment monitoring device 130 from the charging station 140. The environmental monitoring platform 150 may transmit the first signal 404 based on determining to dispatch the storage environment monitoring device 130 to perform the one or more environmental measurements. The environmental monitoring platform 150 may transmit the first signal 404 over a wireless connection and/or over a wired connection to the OHT vehicle 124 of the transport system 120.

Figure 4C:
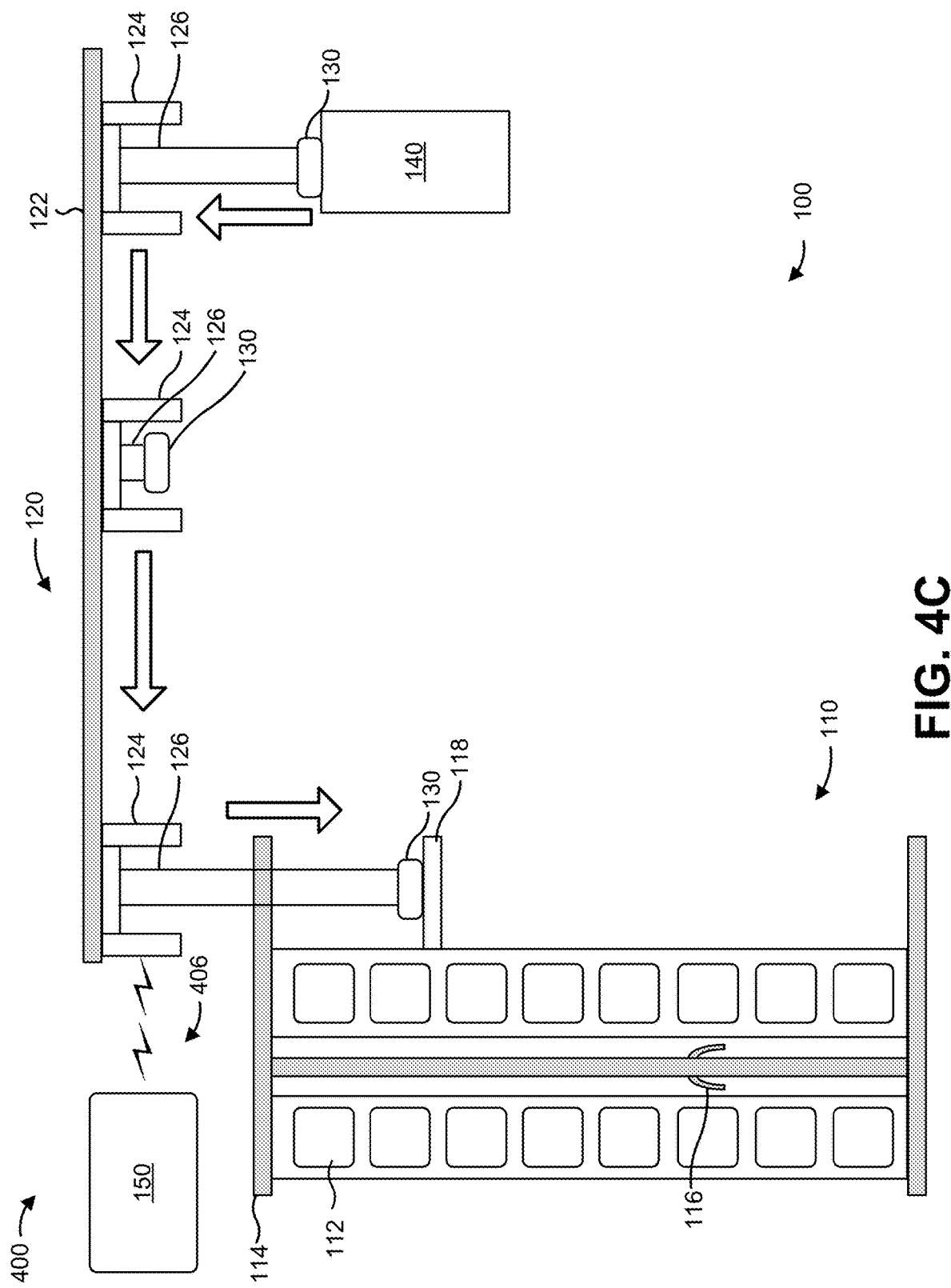

As shown in FIG. 4C, the transport system 120 may retrieve the storage environment monitoring device 130 from the charging station 140. In particular, the OHT vehicle 124 may receive the first signal 404 and may load the storage environment monitoring device 130 into the OHT vehicle 124 using the lift 126 based on the first signal 404.

As further shown in FIG. 4C, the environmental monitoring platform 150 may transmit (e.g., using the communication interface 304 of the control system 300) a second signal 406 to the transport system 120 (e.g., to the OHT vehicle 124 of the transport system 120) to cause the transport system 120 to transport the storage environment monitoring device 130 to the staging area 118 of the storage system 110. In particular, the OHT vehicle 124 may receive the second signal 406 and may transport the storage environment monitoring device 130 to the staging area 118 based on the second signal 406. The OHT vehicle 124 may transport the storage environment monitoring device 130 to the staging area 118 by traveling along the overhead track 122 and unloading or lowering the storage environment monitoring device 130 onto the staging area 118 using the lift 126.

As shown in FIG. 4D, the environmental monitoring platform 150 may transmit (e.g., using the communication interface 304 of the control system 300) a third signal 408 to the stocker 114 to cause the stocker 114 to transport the storage environment monitoring device 130 from the staging area 118 to a storage area 112 of the one or more storage areas 112 to perform the one or more environmental measurements. The environmental monitoring platform 150 may transmit the third signal 408 over a wireless connection and/or over a wired connection to the stocker 114. In some implementations, the environmental monitoring platform 150 may transmit the third signal 408 based on determining (e.g., using the processor 302) that the storage environment monitoring device 130 has been transported to the staging area 118.

As further shown in FIG. 4D, the stocker 114 may retrieve the storage environment monitoring device 130 from the staging area 118 based on receiving the third signal 408. The stocker 114 may use the crane 116 or another device to retrieve the storage environment monitoring device 130 from the staging area 118.

Figure 4E:
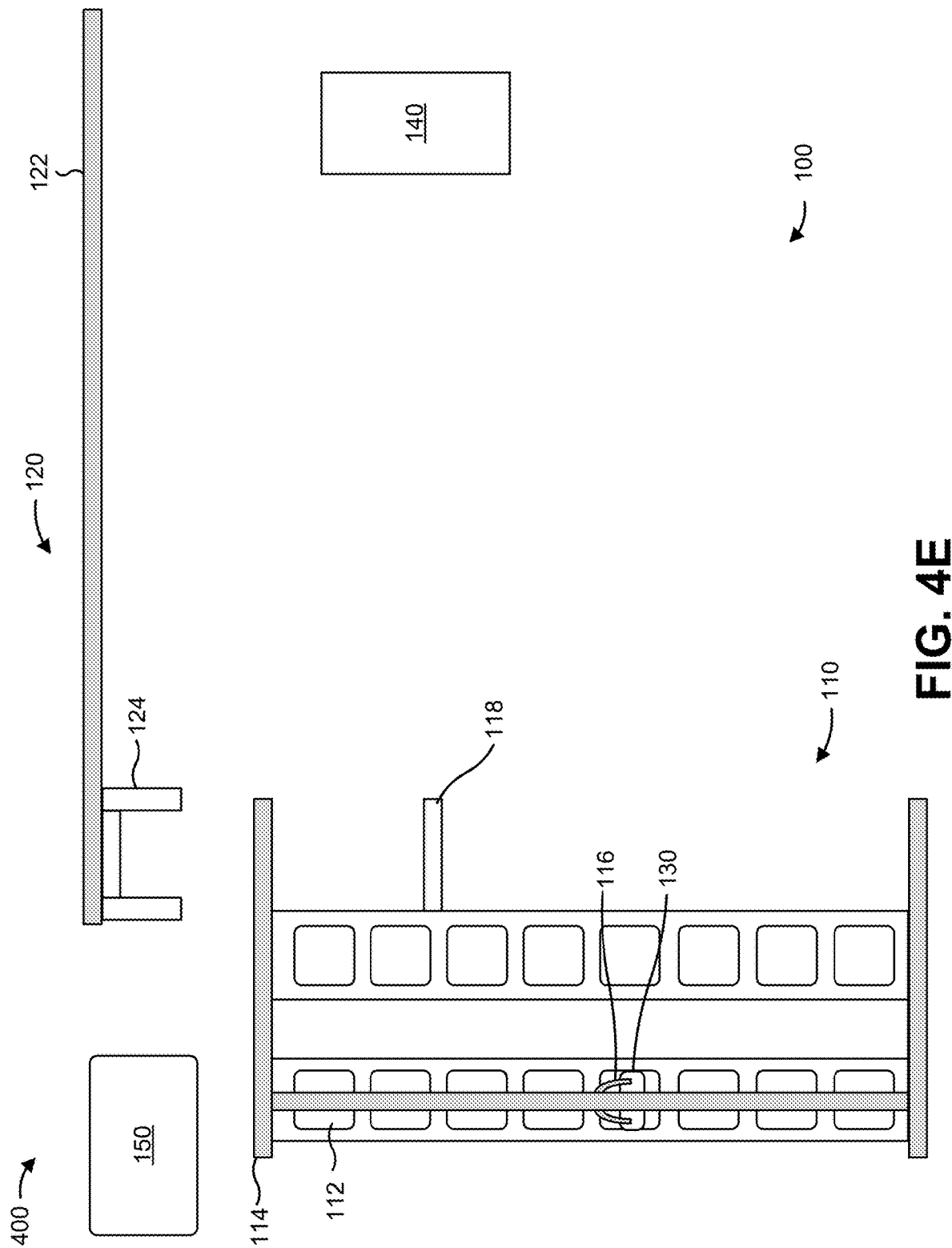

As shown in FIG. 4E, the stocker 114 may transfer the storage environment monitoring device 130 from the staging area 118 to a storage area 112 after retrieving the storage environment monitoring device 130. For example, the stocker 114 may use the crane 116 or another device to transfer the storage environment monitoring device 130 from the staging area 118 to a storage area 112 by placing the storage environment monitoring device 130 in the storage area 112.

Figure 4F:
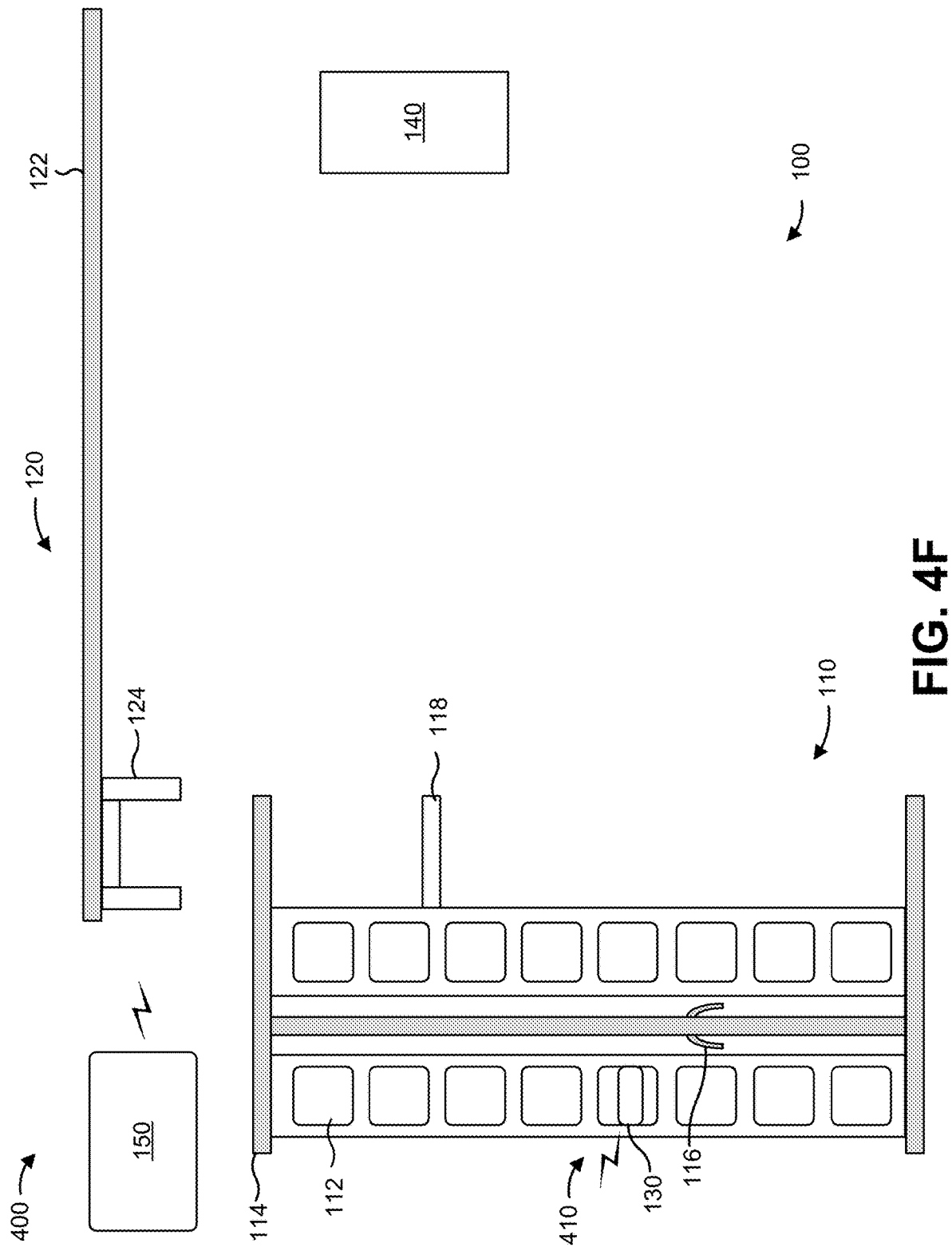

As shown in FIG. 4F, the storage environment monitoring device 130 may perform (e.g., using the processor 216 and the one or more sensors 220 of the control system 214) the one or more environmental measurements of the environment in the storage area 112. For example, the storage environment monitoring device 130 may perform one or more of the various types of environmental measurements described above. As further shown in FIG. 4F, the storage environment monitoring device 130 may transmit (e.g., using the communication interface 218 of the control system 214) an indication 410 of results of the one or more environmental measurements to the environmental monitoring platform 150. The results may be indicated in environmental measurement data generated by the storage environment monitoring device 130. The storage environment monitoring device 130 may transmit the indication 410 over a wireless connection to the environmental monitoring platform 150.

As indicated above, FIGS. 4A-4F are provided as an example. Other examples may differ from what is described with regard to FIGS. 4A-4F.

FIGS. 5A-5D are diagrams of an example implementation 500 described herein. The example implementation 500 may be an example implementation of storage environment monitoring in a semiconductor storage environment such as the semiconductor storage environment 100. In particular, the example implementation 500 may be an example implementation of automatically performing one or more actions associated with an abnormal environment in a storage area 112 based on one or more environmental measurements of the storage environment monitoring device 130.

Figure 5A:
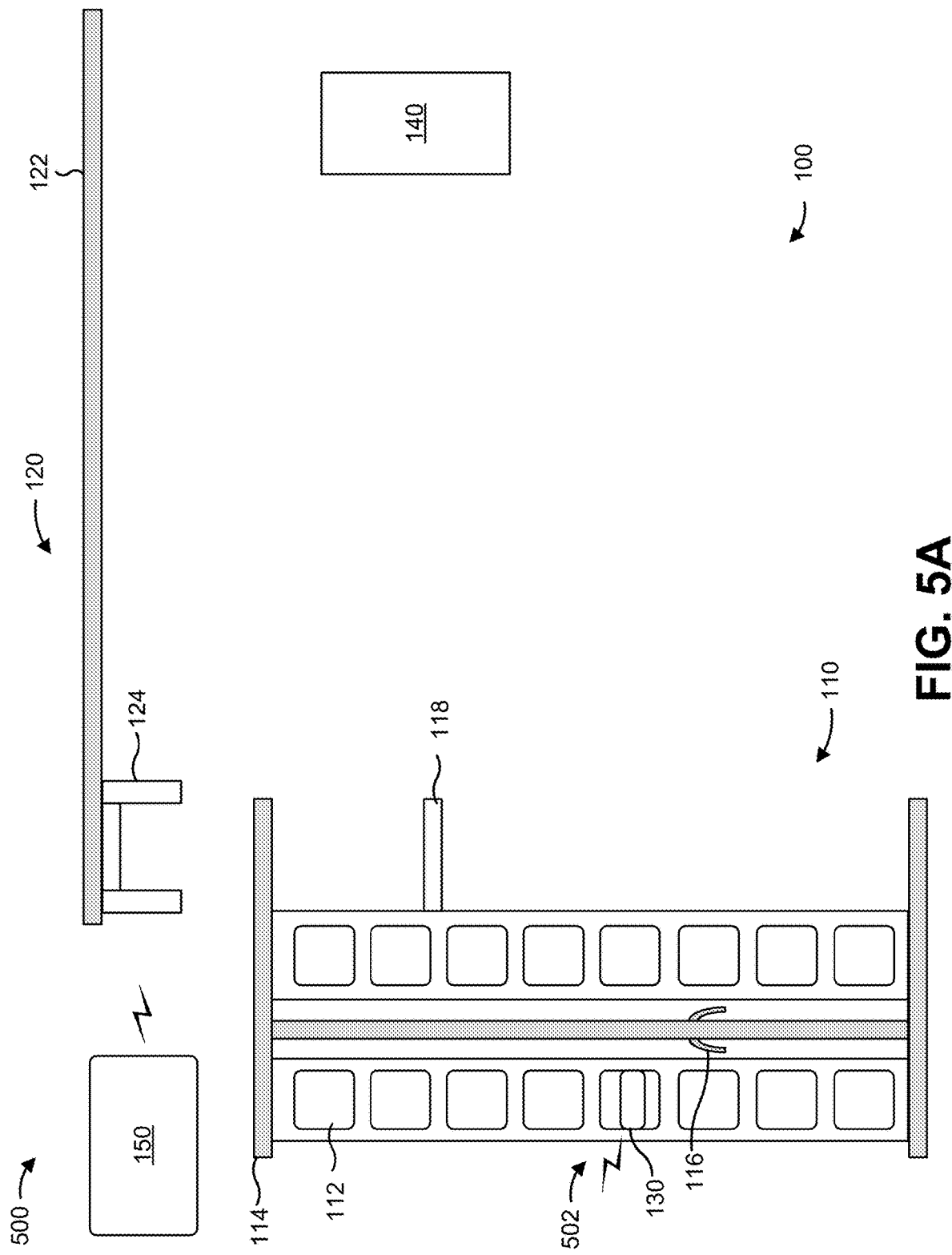

As shown in FIG. 5A, the storage environment monitoring device 130 may transmit (e.g., using the communication interface 218 of the control system 214) a first indication 502 of results of one or more environmental measurements associated with the environment in a first storage area 112 of the storage system 110. The storage environment monitoring device 130 may transmit the first indication 502 over a wireless connection to the environmental monitoring platform 150.

Figure 5B:
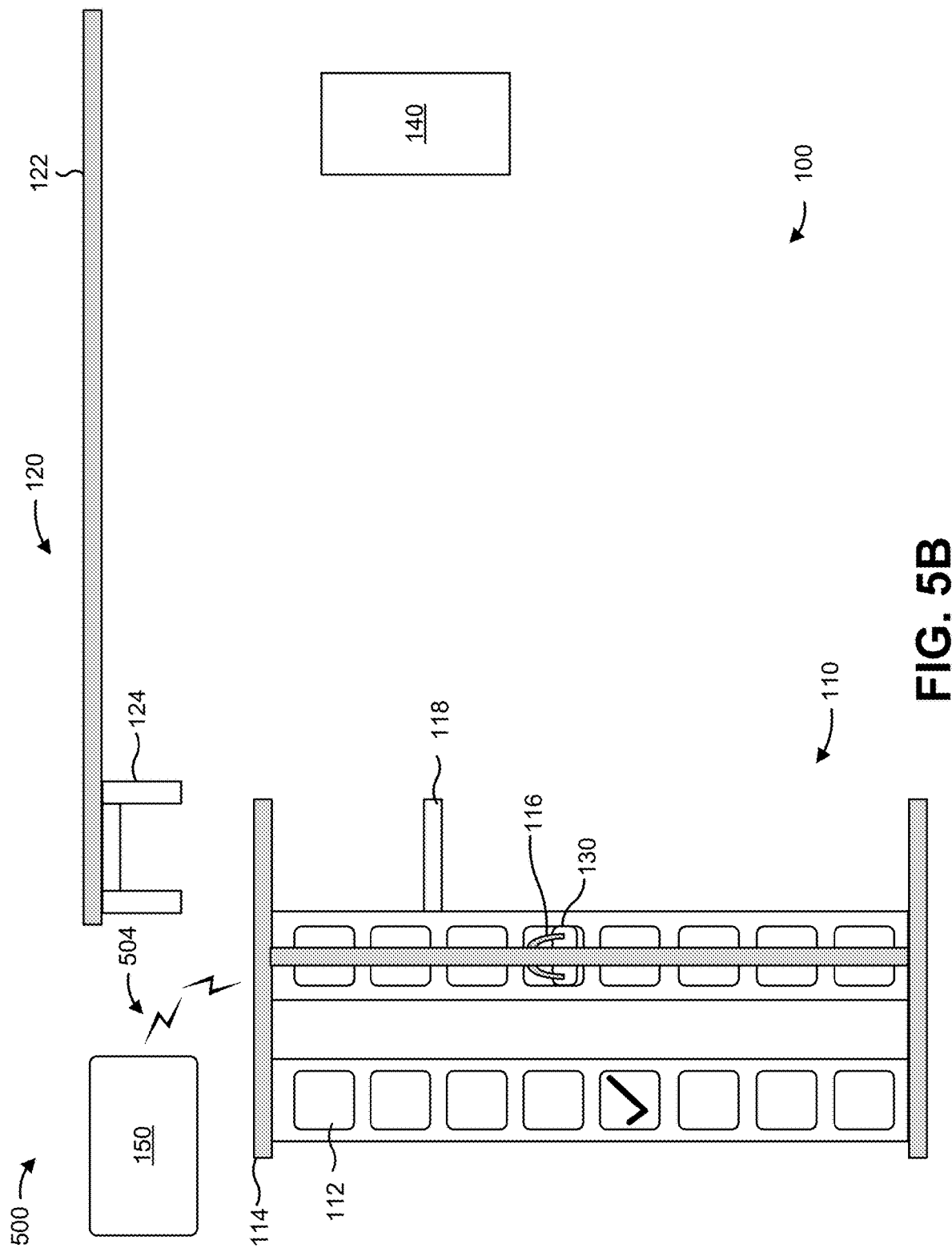

As shown in FIG. 5B, the environmental monitoring platform 150 may determine (e.g., using the processor 302 and/or the machine learning model 308 of the control system 300) that the results of one or more environmental measurements do not satisfy one or more associated threshold (e.g., thereby indicating that the environment in the first storage area 112 is within acceptable environmental operating parameters), as visually indicated in FIG. 5B by the check mark in the first storage area 112. The environmental monitoring platform 150 may determine that the results of one or more environmental measurements do not satisfy the one or more associated thresholds based on the first indication 502.

As further shown in FIG. 5B, the environmental monitoring platform 150 may transmit (e.g., using the communication interface 304 of the control system 300) a first signal 504 to the stocker 114 to cause the stocker 114 to transfer the storage environment monitoring device 130 from the first storage area 112 to a second storage area 112 in the storage system 110. The environmental monitoring platform 150 may transmit the first signal 504 based on determining that the results of one or more environmental measurements do not satisfy the one or more associated thresholds. The stocker 114 may receive the first signal 504 and may transfer the storage environment monitoring device 130 from the first storage area 112 to the second storage area 112 based on the first signal 504. The stocker 114 may use the crane 116 or another device to transfer the storage environment monitoring device 130 from the first storage area 112 to the second storage area 112.

Figure 5C:
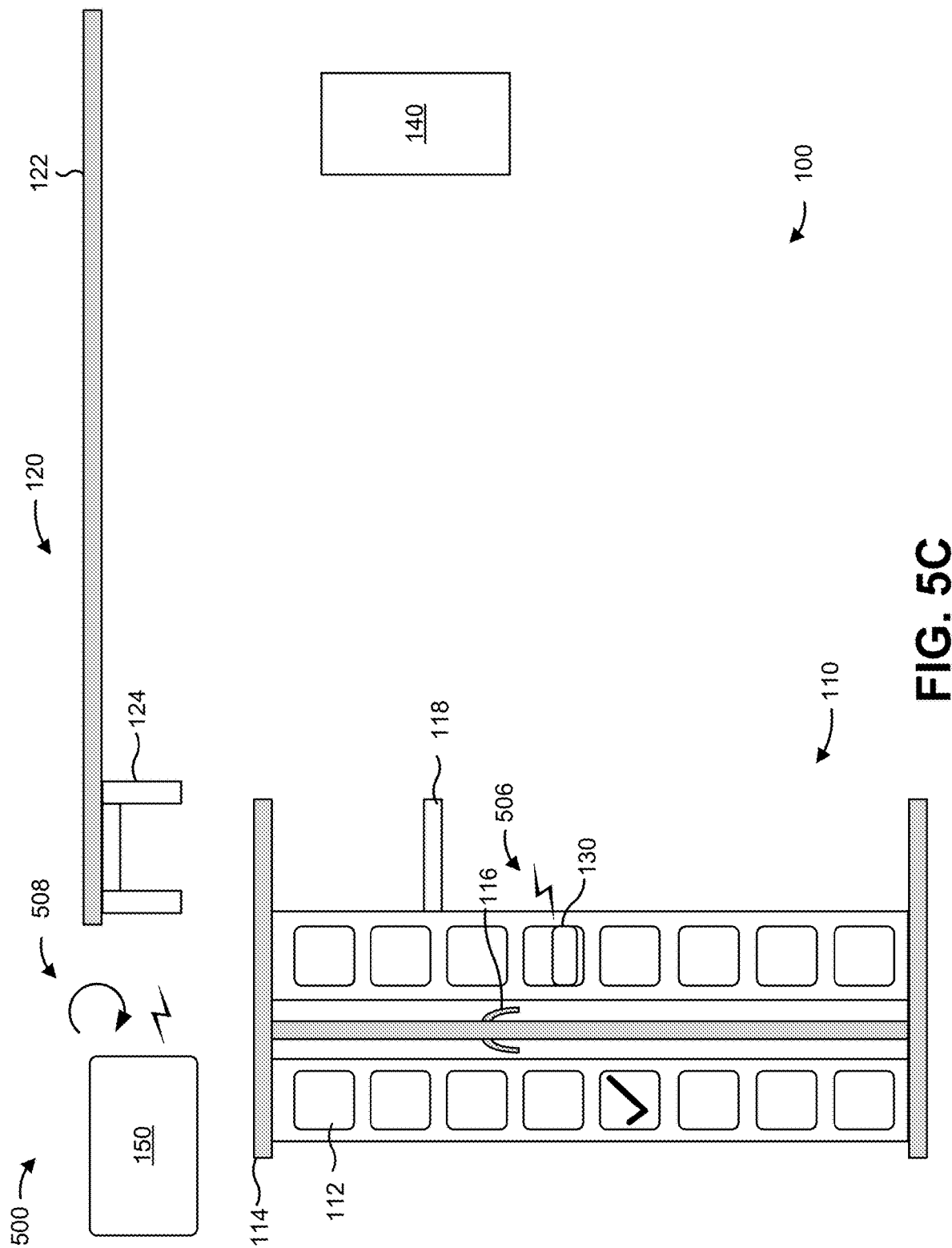

As shown in FIG. 5C, the storage environment monitoring device 130 may transmit (e.g., using the communication interface 218 of the control system 214) a second indication 506 of results of one or more environmental measurements associated with the environment in the second storage area 112. The storage environment monitoring device 130 may transmit the second indication 506 to the environmental monitoring platform 150.

As further shown in FIG. 5C, and by reference number 508, the environmental monitoring platform 150 may determine (e.g., using the processor 302 of the control system 300) that one or more environmental parameters of the environment in the second storage area 112 satisfy one or more associated thresholds. Additionally and/or alternatively, the environmental monitoring platform 150 may determine (e.g., using the processor 302 and/or the machine learning model 308 of the control system 300) that the one or more environmental parameters of the environment in the second storage area 112 are trending toward the one or more thresholds and are estimated to satisfy the one or more thresholds. The environmental monitoring platform 150 may determine that one or more environmental parameters of the environment in the second storage area 112 satisfy (or are estimated to satisfy) the one or more thresholds based the results of one or more environmental measurements associated with the environment in the second storage area 112.

Figure 5D:
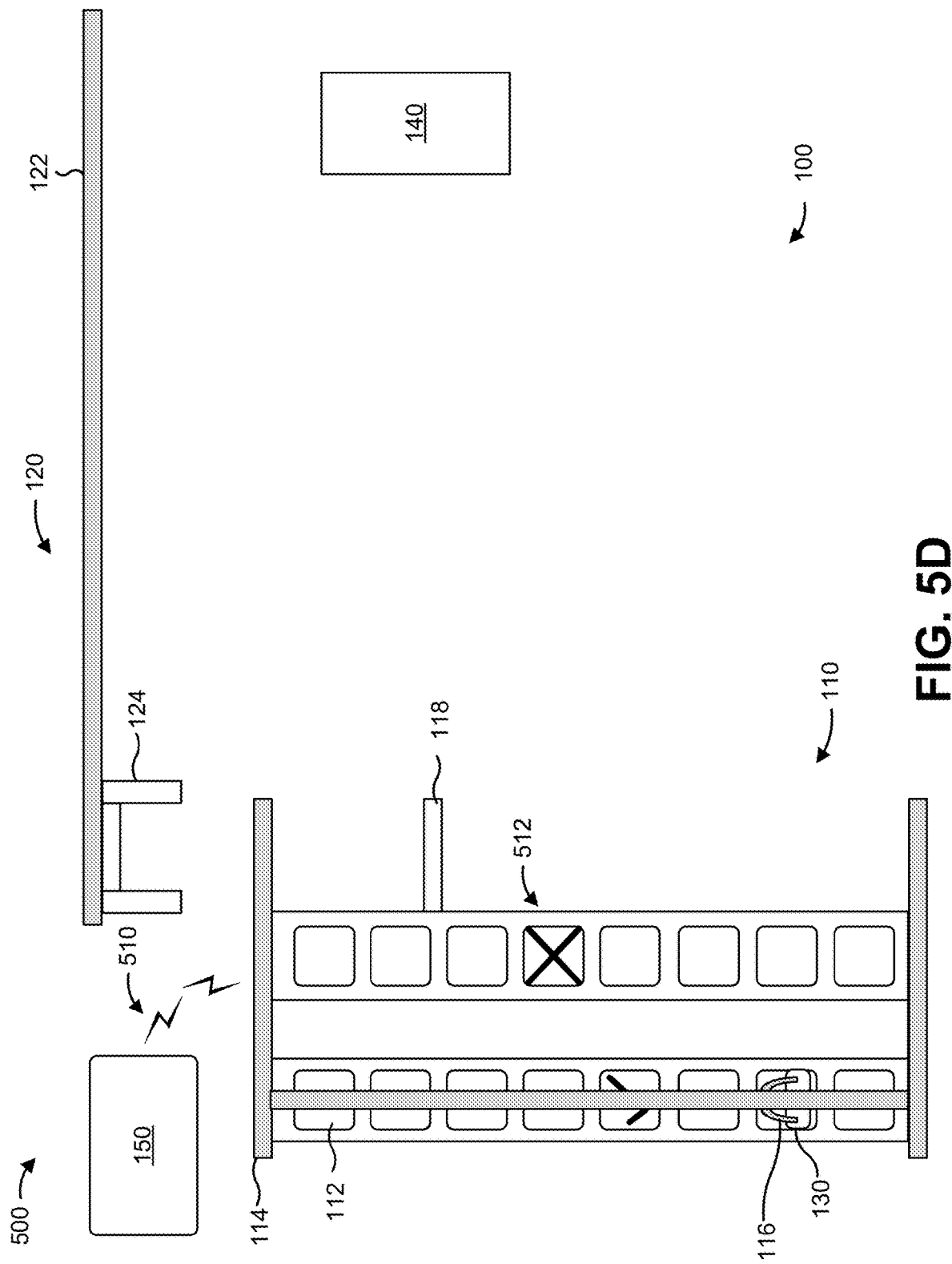

As shown in FIG. 5D, the environmental monitoring platform 150 may automatically perform (or may automatically cause another device or system to perform) one or more actions associated with the second storage area 112 based on determining that one or more environmental parameters of the second storage area 112 satisfy (or are estimated to satisfy) the one or more thresholds. For example, as shown by reference number 510, the environmental monitoring platform 150 may automatically transmit a second signal to the stocker 114 to cause the stocker 114 to remove the storage environment monitoring device 130 from the second storage area 112. As another example, and as shown by reference number 512, the environmental monitoring platform may deactivate (or lock) the second storage area 112 (e.g., as visually indicated by the X in FIG. 5D) so that the second storage area 112 is not used. As another example, the environmental monitoring platform 150 may automatically transmit a third signal to the storage system 110 to cause the storage system 110 to automatically adjust the one or more environmental parameters of the second storage area 112, as described above.

As indicated above, FIGS. 5A-5D are provided as an example. Other examples may differ from what is described with regard to FIGS. 5A-5D.

FIGS. 6A-6D are diagrams of an example implementation 600 described herein. The example implementation 600 may be an example implementation of storage environment monitoring in a semiconductor storage environment such as the semiconductor storage environment 100. In particular, the example implementation 600 may be an example implementation of returning the storage environment monitoring device 130 from the storage system 110 to the charging station 140 so that the battery 224 of the storage environment monitoring device 130 may be charged.

Figure 6A:
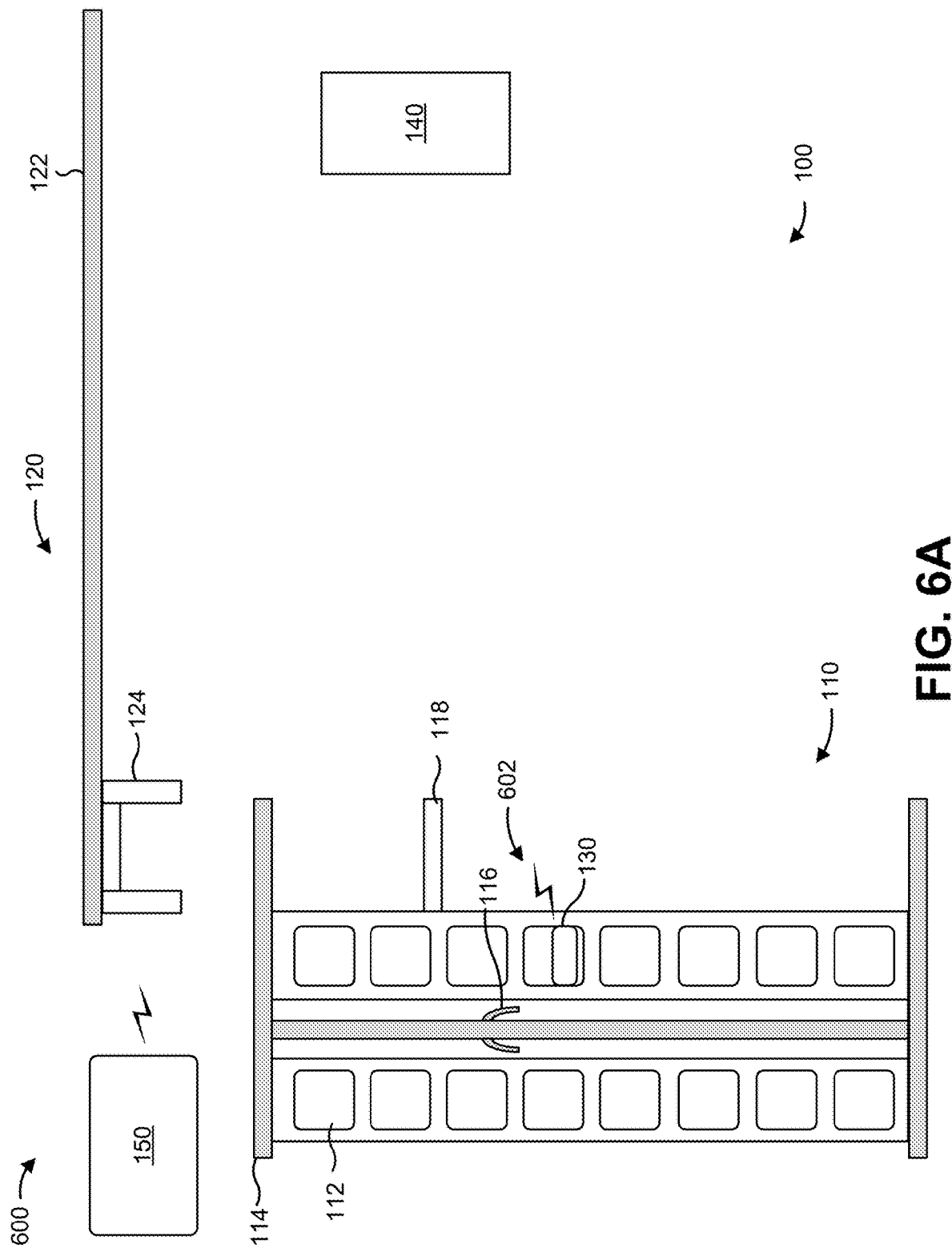

As shown in FIG. 6A, the storage environment monitoring device 130 may transmit (e.g., using the communication interface 218 of the control system 214) an indication 602 of results of one or more environmental measurements associated with a storage area 112 of the storage system 110. The storage environment monitoring device 130 may transmit the indication 602 to the environmental monitoring platform 150 over a wireless connection. In some implementations, the indication 602 may further indicate a remaining battery life of the battery 224 of the storage environment monitoring device 130.

Figure 6B:
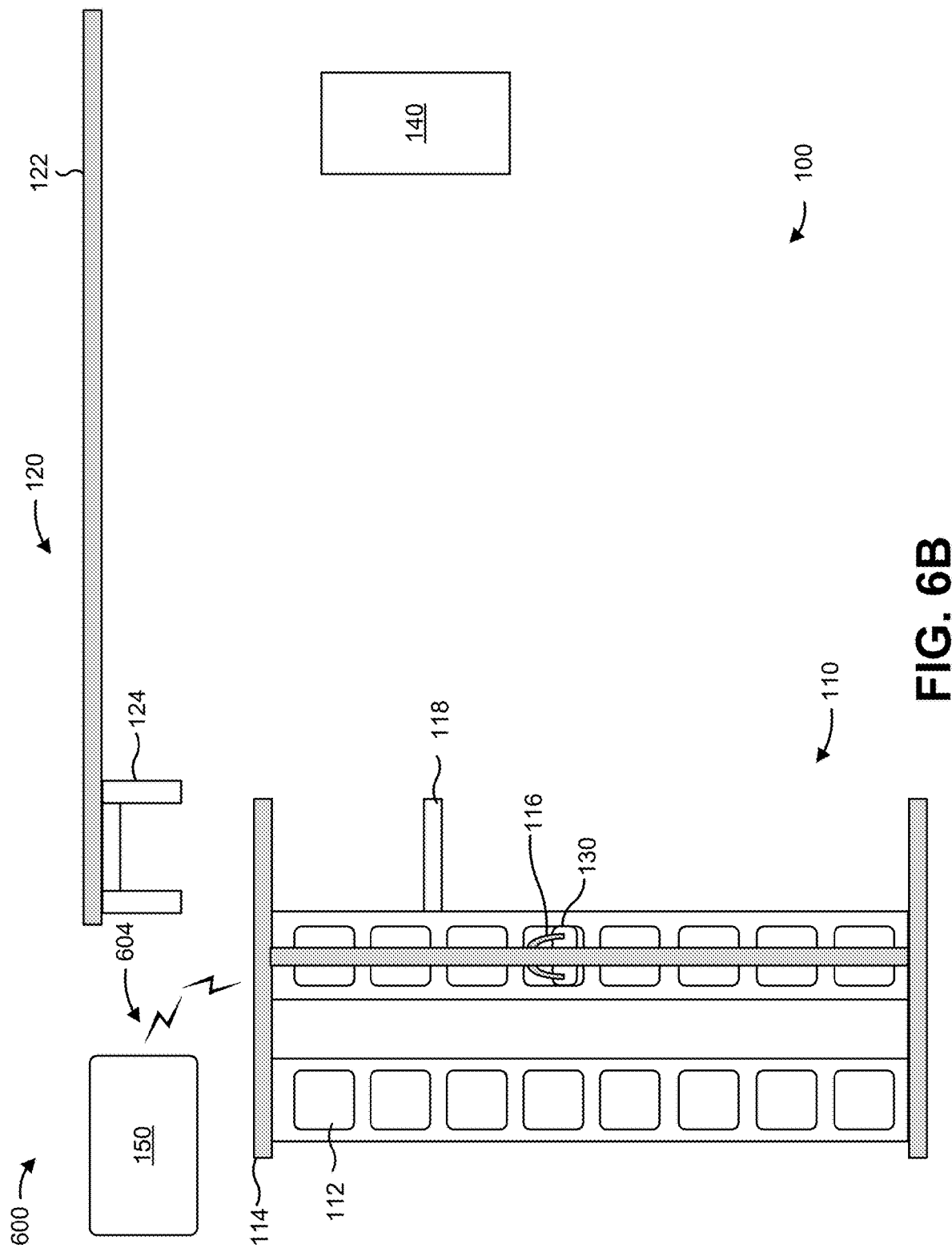

As shown in FIG. 6B, the environmental monitoring platform 150 may transmit (e.g., using the communication interface 304 of the control system 300) a first signal 604 to the stocker 114 to cause the stocker 114 to transfer the storage environment monitoring device 130 from the storage area 112 to the staging area 118 of the storage system 110. The stocker 114 may receive the first signal 604 and may retrieve (e.g., using the crane 116 or another device) the storage environment monitoring device 130 from the storage area 112 based on the first signal 604. In some implementations, the environmental monitoring platform 150 may transmit the first signal 604 based on determining (e.g., using the processor 302 of the control system 300) that the storage environment monitoring device 130 has completed an environmental monitoring schedule for the storage system 110. In some implementations, the environmental monitoring platform 150 may transmit the first signal 604 based on determining (e.g., using the processor 302 of the control system 300) that the remaining battery life of the battery 224 of the storage environment monitoring device 130 satisfies a battery life threshold. The environmental monitoring platform 150 may determine that the remining battery life satisfies a battery life threshold based on the indication 602.

As shown in FIG. 6C, the stocker 114 may transfer (e.g., using the crane 116 or another device) the storage environment monitoring device 130 from the storage area 112 to the staging area 118. The stocker 114 may transfer the storage environment monitoring device 130 from the storage area 112 to the staging area 118 based on retrieving the storage environment monitoring device 130 from the storage area 112.

Figure 6D:
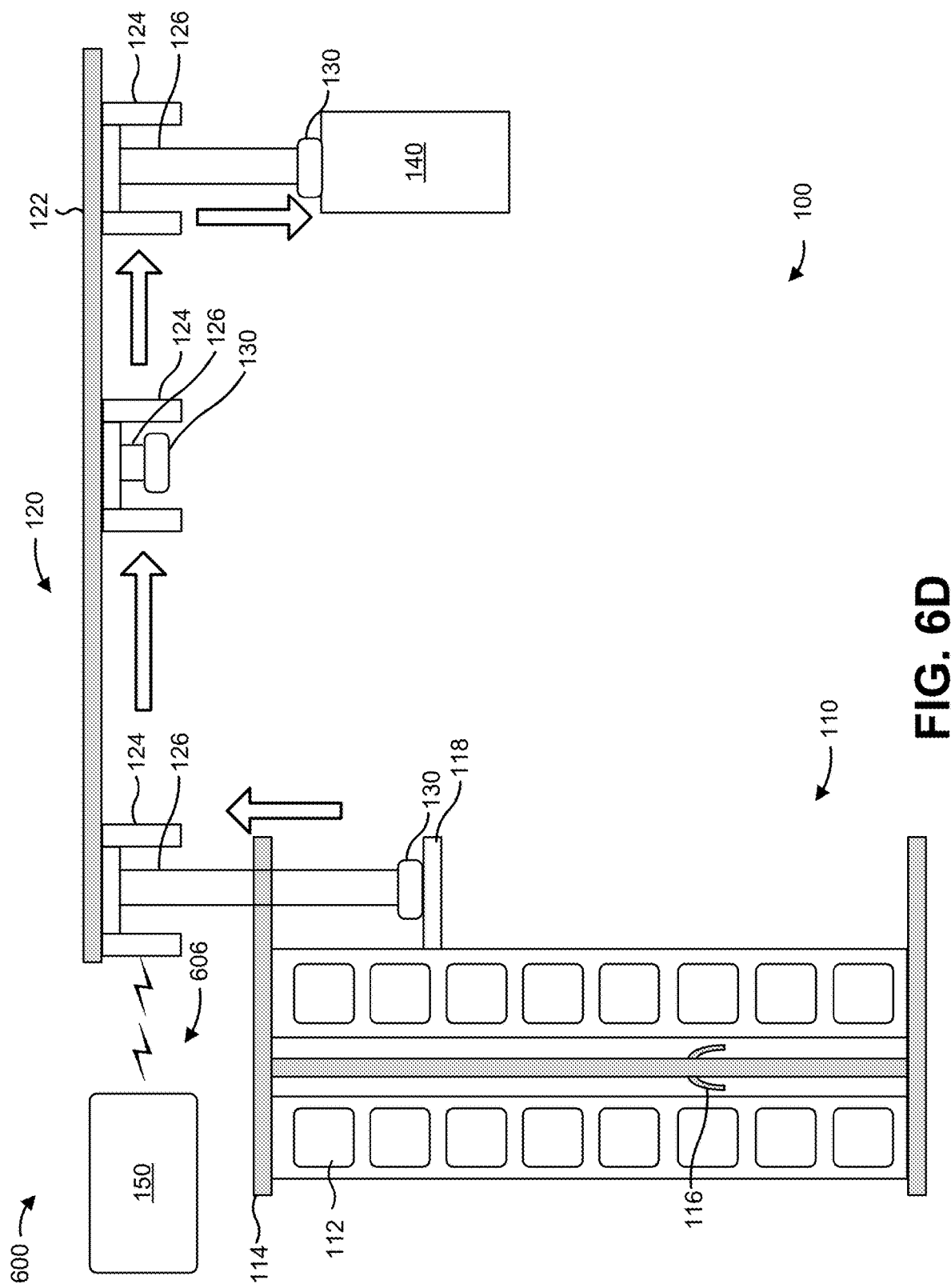

As shown in FIG. 6D, the environmental monitoring platform 150 may transmit a second signal 606 to the transport system 120 to cause the transport system 120 to retrieve the storage environment monitoring device 130 from the staging area 118 and to transfer the storage environment monitoring device 130 to the charging station 140. In particular, the OHT vehicle 124 may receive the second signal 606 and may load the storage environment monitoring device 130 into the OHT vehicle 124 from the staging area 118 using the lift 126 based on the second signal 606. The OHT vehicle 124 may transport the storage environment monitoring device 130 to the charging station 140 by traveling along the overhead track 122 and unloading or lowering the storage environment monitoring device 130 onto charging station 140 using the lift 126 so that the charging station 140 may charge the battery 224 of the storage environment monitoring device 130.

As indicated above, FIGS. 6A-6D are provided as an example. Other examples may differ from what is described with regard to FIGS. 6A-6D.

Figure 7:
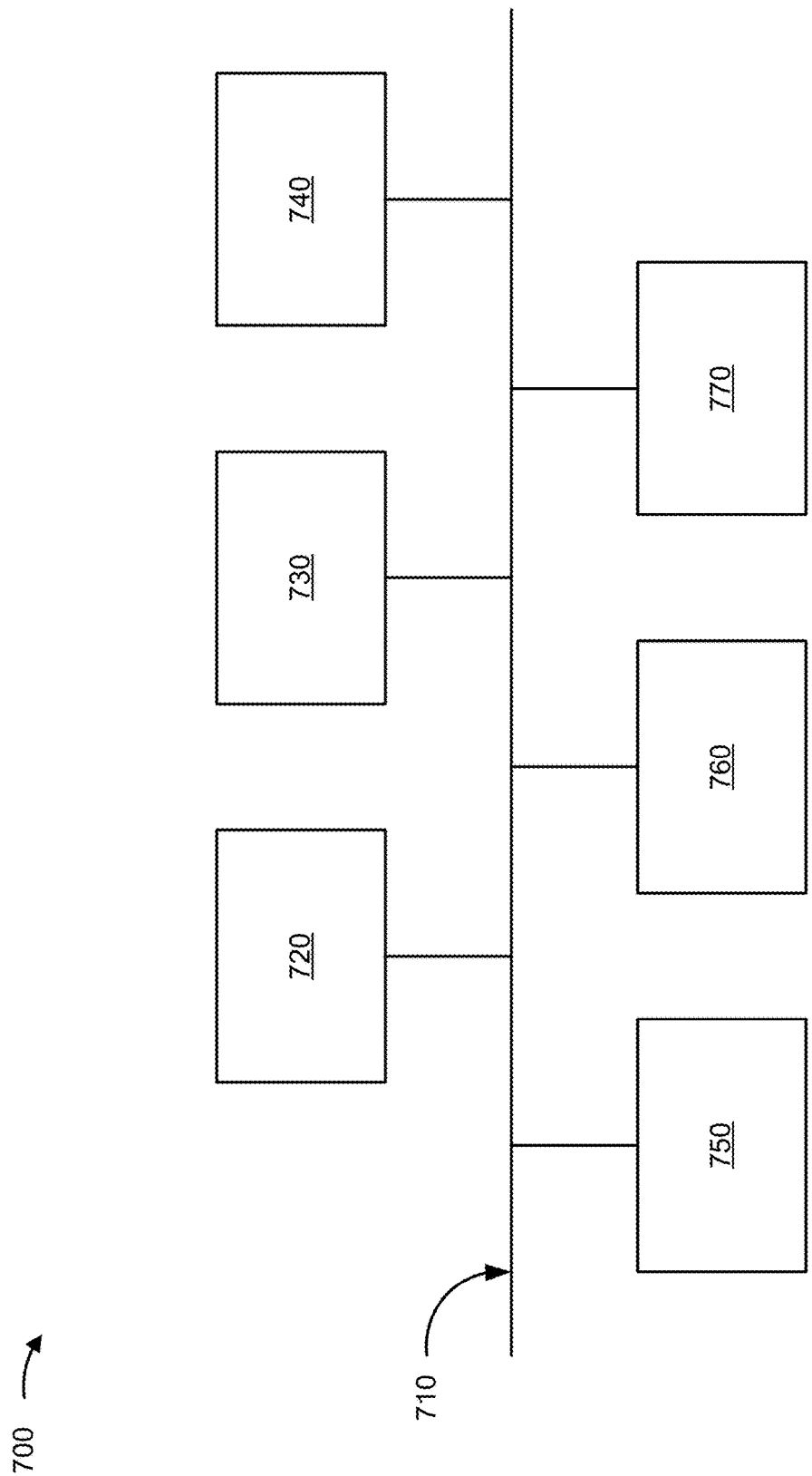
FIG. 7 is a diagram of example components of one or more devices of FIGS. 1, 2C, and/or 3.

FIG. 7 is a diagram of example components of a device 700, which may correspond to the storage system 110, the transport system 120, the storage environment monitoring device 130, the charging station 140, the environmental monitoring platform 150, the control system 214, the processor 216, the communication interface 218, the one or more sensors 220, the data structure 222, the battery 224, the charging device 226, the control system 300, the processor 302, the communication interface 304, and/or the data structure 306. In some implementations, the storage system 110, the transport system 120, the storage environment monitoring device 130, the charging station 140, the environmental monitoring platform 150, the control system 214, the processor 216, the communication interface 218, the one or more sensors 220, the data structure 222, the battery 224, the charging device 226, the control system 300, the processor 302, the communication interface 304, and/or the data structure 306 may include one or more devices 700 and/or one or more components of device 700. As shown in FIG. 7, device 700 may include a bus 710, a processor 720, a memory 730, a storage component 740, an input component 750, an output component 760, and a communication component 770.

Bus 710 includes a component that enables wired and/or wireless communication among the components of device 700. Processor 720 includes a central processing unit, a graphics processing unit, a microprocessor, a controller, a microcontroller, a digital signal processor, a field-programmable gate array, an application-specific integrated circuit, and/or another type of processing component. Processor 720 is implemented in hardware, firmware, or a combination of hardware and software. In some implementations, processor 720 includes one or more processors capable of being programmed to perform a function. Memory 730 includes a random access memory, a read only memory, and/or another type of memory (e.g., a flash memory, a magnetic memory, and/or an optical memory).

Storage component 740 stores information and/or software related to the operation of device 700. For example, storage component 740 may include a hard disk drive, a magnetic disk drive, an optical disk drive, a solid state disk drive, a compact disc, a digital versatile disc, and/or another type of non-transitory computer-readable medium. Input component 750 enables device 700 to receive input, such as user input and/or sensed inputs. For example, input component 750 may include a touch screen, a keyboard, a keypad, a mouse, a button, a microphone, a switch, a sensor, a global positioning system component, an accelerometer, a gyroscope, and/or an actuator. Output component 760 enables device 700 to provide output, such as via a display, a speaker, and/or one or more light-emitting diodes. Communication component 770 enables device 700 to communicate with other devices, such as via a wired connection and/or a wireless connection. For example, communication component 770 may include a receiver, a transmitter, a transceiver, a modem, a network interface card, and/or an antenna.

Device 700 may perform one or more processes described herein. For example, a non-transitory computer-readable medium (e.g., memory 730 and/or storage component 740) may store a set of instructions (e.g., one or more instructions, code, software code, and/or program code) for execution by processor 720. Processor 720 may execute the set of instructions to perform one or more processes described herein. In some implementations, execution of the set of instructions, by one or more processors 720, causes the one or more processors 720 and/or the device 700 to perform one or more processes described herein. In some implementations, hardware circuitry may be used instead of or in combination with the instructions to perform one or more processes described herein. Thus, implementations described herein are not limited to any specific combination of hardware circuitry and software.

The number and arrangement of components shown in FIG. 7 are provided as an example. Device 700 may include additional components, fewer components, different components, or differently arranged components than those shown in FIG. 7. Additionally, or alternatively, a set of components (e.g., one or more components) of device 700 may perform one or more functions described as being performed by another set of components of device 700.

Figure 8:
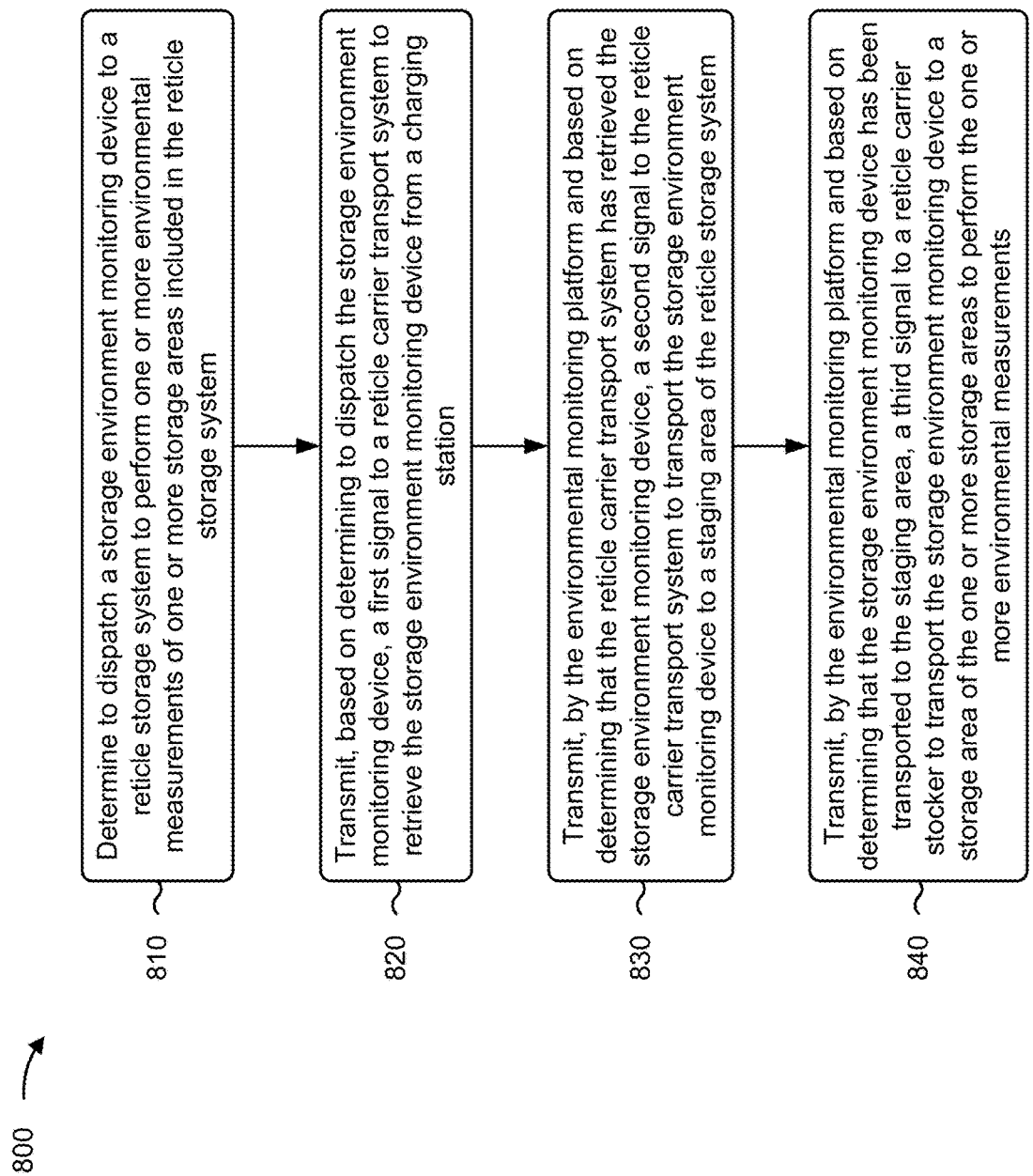

FIG. 8 is a flowchart of an example process 800 associated with storage environment monitoring. In some implementations, one or more process blocks of FIG. 8 may be performed by an environmental monitoring platform (e.g., the environmental monitoring platform 150). In some implementations, one or more process blocks of FIG. 8 may be performed by another device or a group of devices separate from or including the environmental monitoring platform, such as storage system (e.g., the storage system 110), a stocker (e.g., the stocker 114), a transport system (e.g., the transport system 120), a storage environment monitoring device (e.g., the storage environment monitoring device 130), and/or a charging station (e.g., the charging station 140). Additionally, or alternatively, one or more process blocks of FIG. 8 may be performed by one or more components of the control system 214 (e.g., the processor 216, the communication interface 218, the one or more sensors 220, the data structure 222, the battery 224, and/or the charging device 226), one or more components of the control system 300 (e.g., the processor 302, the communication interface 304, the data structure 306, and/or the machine learning model 308), and/or one or more components of the device 700 (e.g., the processor 720, the memory 730, the storage component 740, the input component 750, the output component 760, and/or the communication component 770).

As shown in FIG. 8, process 800 may include determining to dispatch a storage environment monitoring device to a reticle storage system to perform one or more environmental measurements of one or more storage areas included in the reticle storage system (block 810). For example, the environmental monitoring platform 150 may determine to dispatch the storage environment monitoring device 130 to a reticle storage system (e.g., the storage system 110) to perform one or more environmental measurements of one or more storage areas 112 included in the reticle storage system (e.g., the storage system 110), as described above.

As further shown in FIG. 8, process 800 may include transmitting, based on determining to dispatch the storage environment monitoring device, a first signal to a reticle carrier transport system to retrieve the storage environment monitoring device from a charging station (block 820). For example, the environmental monitoring platform 150 may transmit, based on determining to dispatch the storage environment monitoring device 130, the first signal 404 to a reticle carrier transport system (e.g., the transport system 120) to retrieve the storage environment monitoring device 130 from the charging station 140, as described above.

As further shown in FIG. 8, process 800 may include transmitting, based on determining that the reticle carrier transport system has retrieved the storage environment monitoring device, a second signal to the reticle carrier transport system to transport the storage environment monitoring device to a staging area of the reticle storage system (block 830). For example, the environmental monitoring platform 150 may transmit, based on determining that the reticle carrier transport system (e.g., the transport system 120) has retrieved the storage environment monitoring device 130, the second signal 406 to the reticle carrier transport system (e.g., the transport system 120) to transport the storage environment monitoring device 130 to the staging area 118 of the reticle storage system (e.g., the storage system 110), as described above.

As further shown in FIG. 8, process 800 may include transmitting, based on determining that the storage environment monitoring device has been transported to the staging area, a third signal to a reticle carrier stocker to transport the storage environment monitoring device to a storage area of the one or more storage areas to perform the one or more environmental measurements (block 840). For example, the environmental monitoring platform 150 may transmit, based on determining that the storage environment monitoring device 130 has been transported to the staging area 118, the third signal 408 to a reticle carrier stocker (e.g., the stocker 114) to transport the storage environment monitoring device 130 to a storage area 112 of the one or more storage areas 112 to perform the one or more environmental measurements, as described above.

Process 800 may include additional implementations, such as any single implementation or any combination of implementations described below and/or in connection with one or more other processes described elsewhere herein.

In a first implementation, process 800 includes receiving, from the storage environment monitoring device, an indication 602 of results of the one or more environmental measurements, transmitting, based on receiving the indication 602, a fourth signal (e.g., the first signal 604) to the reticle carrier stocker to transport the storage environment monitoring device to the staging area, and transmitting, based on determining that the storage environment monitoring device is in the staging area, a fifth signal (e.g., the second signal 606) to transport the storage environment monitoring device from the staging area to the charging station. In a second implementation, alone or in combination with the first implementation, process 800 includes receiving, from the storage environment monitoring device, a first indication 502 of results of the one or more environmental measurements, where the storage area is a first storage area, and where the one or more environmental measurements are one or more first environmental measurements associated with the first storage area, transmitting, based on receiving the first indication 502, a fourth signal (e.g., the first signal 504) to the reticle carrier stocker to transport the storage environment monitoring device to a second storage area of the one or more storage areas, and receiving, from the storage environment monitoring device, a second indication 506 of results of one or more second environmental measurements associated with the second storage area.

In a third implementation, alone or in combination with one or more of the first and second implementations, determining to dispatch the storage environment monitoring device to the reticle storage system to perform the one or more environmental measurements includes determining to dispatch the storage environment monitoring device based on configured usage schedules for reticles that are to be stored in the one or more storage areas. In a fourth implementation, alone or in combination with one or more of the first through third implementations, process 800 includes receiving, from the storage environment monitoring device, an indication (e.g., the second indication 506) of results of the one or more environmental measurements, and determining, using a machine learning model (e.g., the machine learning model 308) and based on the results, that one or more environmental parameters of the storage area are estimated to satisfy one or more thresholds, and performing one or more actions associated with the storage area based on determining that one or more environmental parameters of the storage area are estimated to satisfy the one or more thresholds.

In a fifth implementation, alone or in combination with one or more of the first through fourth implementations, process 800 includes storing the results in a data structure (e.g., the data structure 306) along with historical results of one or more historical environmental measurements associated with the reticle storage system, storing outcomes of the one or more actions along with historical outcomes of one or more historical actions in the data structure, and updating the machine learning model based on the results, the historical results, the outcomes and the historical outcomes. In a sixth implementation, alone or in combination with one or more of the first through fifth implementations, the storage environment monitoring device is removably secured to a reticle carrier.

Although FIG. 8 shows example blocks of process 800, in some implementations, process 800 may include additional blocks, fewer blocks, different blocks, or differently arranged blocks than those depicted in FIG. 8. Additionally, or alternatively, two or more of the blocks of process 800 may be performed in parallel.

FIG. 9 is a flowchart of an example process 900 associated with storage environment monitoring. In some implementations, one or more process blocks of FIG. 9 may be performed by an environmental monitoring platform (e.g., the environmental monitoring platform 150). In some implementations, one or more process blocks of FIG. 9 may be performed by another device or a group of devices separate from or including the environmental monitoring platform, such as storage system (e.g., the storage system 110), a reticle carrier stocker (e.g., the stocker 114), a transport system (e.g., the transport system 120), a storage environment monitoring device (e.g., the storage environment monitoring device 130), and/or a charging station (e.g., the charging station 140). Additionally, or alternatively, one or more process blocks of FIG. 9 may be performed by one or more components of the control system 214 (e.g., the processor 216, the communication interface 218, the one or more sensors 220, the data structure 222, the battery 224, and/or the charging device 226), one or more components of the control system 300 (e.g., the processor 302, the communication interface 304, the data structure 306, and/or the machine learning model 308), and/or one or more components of the device 700 (e.g., the processor 720, the memory 730, the storage component 740, the input component 750, the output component 760, and/or the communication component 770).

As shown in FIG. 9, process 900 may include receiving an indication of results of one or more environmental measurements associated with a storage area of a storage system, where the indication of the results of the one or more environmental measurements are received from a storage environment monitoring device in the storage area (block 910). For example, the environmental monitoring platform 150 may receive the indication 506 of results of one or more environmental measurements associated with a storage area 112 of the storage system 110, as described above. In some implementations, the indication 506 of the results of the one or more environmental measurements are received from the storage environment monitoring device 130 in the storage area 112.

As further shown in FIG. 9, process 900 may include determining, based on the results, that one or more environmental parameters of the storage area satisfy one or more thresholds (block 920). For example, the environmental monitoring platform 150 may determine, based on the results, that one or more environmental parameters of the storage area 112 satisfy one or more thresholds, as described above.

As further shown in FIG. 9, process 900 may include, based on determining that one or more environmental parameters of the storage area satisfy the one or more thresholds, causing the storage environment monitoring device to be removed from the storage area and deactivating the storage area so that the storage area is not used (block 930). For example, the environmental monitoring platform 150 may, based on determining that one or more environmental parameters of the storage area 112 satisfy the one or more thresholds, cause the storage environment monitoring device 130 to be removed from the storage area 112 and deactivate the storage area 112 so that the storage area 112 is not used, as described above.

Process 900 may include additional implementations, such as any single implementation or any combination of implementations described below and/or in connection with one or more other processes described elsewhere herein.

In a first implementation, the storage environment monitoring device is integrated into a reticle carrier. In a second implementation, alone or in combination with the first implementation, the storage environment monitoring device includes a standalone device that is sized to satisfy one or more standardized reticle carrier dimensional parameters. In a third implementation, alone or in combination with one or more of the first and second implementations, process 900 includes adjusting a temperature of the storage area based on determining that a temperature parameter, of the one or more environmental parameters, satisfies a temperature threshold of the one or more thresholds.

In a fourth implementation, alone or in combination with one or more of the first through third implementations, process 900 includes reducing a humidity of the storage area based on determining that a humidity parameter, of the one or more environmental parameters, satisfies a temperature threshold of the one or more thresholds. In a fifth implementation, alone or in combination with one or more of the first through fourth implementations, process 900 includes at least one of adjusting a flow rate of air into the storage area based on determining that an airflow parameter, of the one or more environmental parameters, satisfies an airflow threshold of the one or more thresholds, or causing an air filter associated with the storage area to be cleaned based on determining that an airflow parameter, of the one or more environmental parameters, satisfies an airflow threshold of the one or more thresholds.

Although FIG. 9 shows example blocks of process 900, in some implementations, process 900 may include additional blocks, fewer blocks, different blocks, or differently arranged blocks than those depicted in FIG. 9. Additionally, or alternatively, two or more of the blocks of process 900 may be performed in parallel.

In this way, a storage environment monitoring device is capable of measuring and/or monitoring various parameters of an environment inside a storage area, such as airflow, temperature, and humidity, to increase the storage quality of semiconductor components stored in the storage area. The storage environment monitoring device is capable of measuring and/or monitoring the parameters of the environment inside the storage area without having to open an enclosure that is storing the semiconductor components in the storage area. This reduces exposure of the semiconductor components to contamination and other environmental factors that might otherwise result in reticle damage and/or defects, oxidation of semiconductor wafers, and/or humidity damage to semiconductor wafers, among other examples. In addition, the storage environment monitoring device may perform automatic measurements inside the storage area based on usage schedules of the semiconductor components that are to be stored in the storage area, which decreases downtime of the storage area and/or the semiconductor components, and increases productivity in a semiconductor processing environment in which the semiconductor components are used.

As described in greater detail above, some implementations described herein provide a method. The method includes determining, by an environmental monitoring platform, to dispatch a storage environment monitoring device to a reticle storage system to perform one or more environmental measurements of one or more storage areas included in the reticle storage system. The method includes transmitting, by the environmental monitoring platform and based on determining to dispatch the storage environment monitoring device, a first signal to a reticle carrier transport system to retrieve the storage environment monitoring device from a charging station. The method includes transmitting, by the environmental monitoring platform and based on determining that the reticle carrier transport system has retrieved the storage environment monitoring device, a second signal to the reticle carrier transport system to transport the storage environment monitoring device to a staging area of the reticle storage system. The method includes transmitting, by the environmental monitoring platform and based on determining that the storage environment monitoring device has been transported to the staging area, a third signal to a reticle carrier stocker to transport the storage environment monitoring device to a storage area of the one or more storage areas to perform the one or more environmental measurements.

As described in greater detail above, some implementations described herein provide a storage environment monitoring device. The storage environment monitoring device includes a housing. The storage environment monitoring device includes a plurality of ports, through the housing, configured to expose an internal space in the housing to an environment of a storage area. The storage environment monitoring device includes a control system, including, a plurality of sensors configured to: perform one or more measurements associated with the environment of the storage area, and generate environmental measurement data based on results of the one or more measurements, and a communication interface configured to transmit the environmental measurement data to an environmental monitoring platform.

As described in greater detail above, some implementations described herein provide a method. The method includes receiving, by an environmental monitoring platform, an indication of results of one or more environmental measurements associated with a storage area of a storage system, where the indication of the results of the one or more environmental measurements are received from a storage environment monitoring device in the storage area. The method includes determining, by the environmental monitoring platform and based on the results, that one or more environmental parameters of the storage area satisfy one or more thresholds. The method includes based on determining that one or more environmental parameters of the storage area satisfy the one or more thresholds, causing, by the environmental monitoring platform, the storage environment monitoring device to be removed from the storage area and deactivating, by the environmental monitoring platform, the storage area so that the storage area is not used.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   determining, by an environmental monitoring platform, to dispatch a storage environment monitoring device to a reticle storage system to perform one or more environmental measurements of one or more storage areas of a plurality of storage areas of the reticle storage system;
   transmitting, by the environmental monitoring platform and based on determining to dispatch the storage environment monitoring device, a first signal to a reticle carrier transport system to retrieve the storage environment monitoring device from a charging station;
   transmitting, by the environmental monitoring platform and based on determining that the reticle carrier transport system has retrieved the storage environment monitoring device, a second signal to the reticle carrier transport system to transport the storage environment monitoring device to a staging area of the reticle storage system;
   transmitting, by the environmental monitoring platform and based on determining that the storage environment monitoring device has been transported to the staging area, a third signal to a reticle carrier stocker to transport the storage environment monitoring device to a first storage area of the plurality of storage areas to perform the one or more environmental measurements of the first storage area;
   receiving, from the storage environment monitoring device, an indication of results of the one or more environmental measurements;
   determining, using a machine learning model and based on the results, that one or more environmental parameters of the first storage area are estimated to satisfy one or more thresholds associated with one or more abnormal storage environment conditions of the first storage area;
   performing, based on determining that one or more environmental parameters of the first storage area are estimated to satisfy the one or more thresholds, one or more actions associated with the first storage area,
   wherein performing the one or more actions comprises one or more of:
      transmitting a fourth signal to the reticle carrier stocker to transport the storage environment monitoring device to a second storage area of the plurality of storage areas, or
      transmitting a fifth signal to the reticle carrier stocker to automatically deactivate or lock only the first storage area so that the first storage area is not used until the one or more abnormal storage environment conditions of the first storage area are rectified; and updating the machine learning model based on one or more of:
  the results of the one or more environmental measurements, and historical results of one or more historical environmental measurements associated with the reticle storage system, or
  outcomes of the one or more actions, and historical outcomes of one or more historical actions.

2. The method of claim 1, further comprising:
transmitting, based on performing the one or more actions, a sixth signal to the reticle carrier stocker to transport the storage environment monitoring device to the staging area; and
transmitting, based on determining that the storage environment monitoring device is in the staging area, a seventh signal to transport the storage environment monitoring device from the staging area to the charging station.

3. The method of claim 1, wherein the indication of results of the one or more environmental measurements is a first indication of results of one or more first environmental measurements associated with the first storage area, and wherein performing the one or more actions comprises:
  transmitting the fourth signal to the reticle carrier stocker to transport the storage environment monitoring device to the second storage area of the plurality of storage areas; and
  receiving, from the storage environment monitoring device, a second indication of results of one or more second environmental measurements associated with the second storage area.

4. The method of claim 1, wherein determining to dispatch the storage environment monitoring device to the reticle storage system to perform the one or more environmental measurements comprises:
  determining to dispatch the storage environment monitoring device based on a configured usage schedule for a reticle to be stored in the first storage area.

5. The method of claim 1, further comprising:
  storing the results in a data structure along with historical results of one or more historical environmental measurements associated with the reticle storage system; and
  storing outcomes of the one or more actions along with historical outcomes of one or more historical actions in the data structure.

6. The method of claim 1, wherein the storage environment monitoring device is removably secured to a reticle carrier.

7. A method, comprising:
  receiving, by an environmental monitoring platform, an indication of results of one or more environmental measurements associated with a storage area of a plurality of storage areas of a storage system,
    wherein the indication of the results of the one or more environmental measurements are received from a storage environment monitoring device in the storage area;
  determining, by the environmental monitoring platform, using a machine learning model, and based on the results, that one or more environmental parameters of the storage area satisfy one or more thresholds associated with one or more abnormal storage environment conditions of the storage area; and
  based on determining that one or more environmental parameters of the storage area satisfy the one or more thresholds:
    causing, by the environmental monitoring platform, the storage environment monitoring device to be removed from the storage area;
    deactivating or locking, by the environmental monitoring platform, only the storage area so that the storage area is not used until the one or more abnormal storage environment conditions of the storage area are rectified; and
    updating, by the environmental monitoring platform, the machine learning model based on one or more of:
      the results of the one or more environmental measurements, and historical results of one or more historical environmental measurements associated with the storage system, or
      outcomes of causing the storage environment monitoring device to be removed from the storage area and deactivating the storage area, and historical outcomes of one or more historical actions.

8. The method of claim 7, wherein the storage environment monitoring device is integrated into a reticle carrier.

9. The method of claim 7, wherein the storage environment monitoring device includes a standalone device that is sized to satisfy one or more standardized reticle carrier dimensional parameters.

10. The method of claim 7, further comprising:
  adjusting a temperature of the storage area based on determining that a temperature parameter, of the one or more environmental parameters, satisfies a temperature threshold of the one or more thresholds.

11. The method of claim 7, further comprising:
  reducing a humidity of the storage area based on determining that a humidity parameter, of the one or more environmental parameters, satisfies a humidity threshold of the one or more thresholds.

12. The method of claim 7, further comprising at least one of:
  adjusting a flow rate of air into the storage area based on determining that an airflow parameter, of the one or more environmental parameters, satisfies an airflow threshold of the one or more thresholds, or
  causing an air filter associated with the storage area to be cleaned based on determining that an airflow parameter, of the one or more environmental parameters, satisfies an airflow threshold of the one or more thresholds.

13. A device, comprising:
one or more processors, configured to:
  transmit, to a storage environment monitoring device in a first storage area of a plurality of storage areas of a storage system, a first signal to perform one or more environmental measurements associated with the first storage area;
  receive, based on transmitting the first signal, an indication of results of the one or more environmental measurements;
  determine, using a machine learning model and based on the results, that one or more environmental parameters of the first storage area are abnormal; and
  update, based on determining that the one or more environmental parameters of the first storage area are abnormal, the machine learning model based on one or more of:
    the results of the one or more environmental measurements, and historical results of one or more historical environmental measurements associated with the storage system, or outcomes of one or more actions, associated with the first storage area and performed based on determining that the one or more environmental parameters of the first storage area are abnormal, and historical outcomes of one or more historical actions,
  wherein the one or more actions comprises one or more of:
    transmitting a second signal to a reticle carrier stocker to transport the storage environment monitoring device to a second storage area of the plurality of storage areas, or
    transmitting a third signal to the reticle carrier stocker to deactivate or lock only the first storage area so that the first storage area is not used until the one or more environment parameters of the first storage area that are abnormal are rectified.

14. The device of claim 13, wherein the one or more processors are further configured to:
  transmit one or more initial signals to transmit the storage environment monitoring device to the first storage area,
    wherein the first signal is transmitted based on transmitting the one or more initial signals.

15. The device of claim 14, wherein the one or more initial signals comprises:
  a first initial signal to transport the storage environment monitoring device to a staging area, and
  a second initial signal to transport the storage environment monitoring device from the staging area to the first storage area.

16. The device of claim 15, wherein the first initial signal is to transmit the storage environment monitoring device from a charging station to the staging area.

17. The device of claim 16, wherein the one or more processors are further configured to:
  receive, from the charging station, a battery level indication of the storage environment monitoring device,
    wherein the first initial signal is transmitted based on receiving the battery level indication.

18. The device of claim 13, wherein the one or more environmental parameters comprises one or more of a temperature parameter or an airflow parameter.

19. The device of claim 13, wherein the one or more processors are further configured to:
  receive an indication of a remaining battery life of the storage environment monitoring device; and
  cause the storage environment monitoring device to be dispatched to a charging station.

20. The device of claim 13, wherein the one or more processors are further configured to:
  generate an alert based on determining that the one or more environmental parameters of the first storage area are abnormal.

* * * * *